United States Patent
Bour et al.

(10) Patent No.: US 10,319,829 B2
(45) Date of Patent: *Jun. 11, 2019

(54) METHOD AND SYSTEM FOR IN-SITU ETCH AND REGROWTH IN GALLIUM NITRIDE BASED DEVICES

(71) Applicant: NEXGEN POWER SYSTEMS, INC., Santa Clara, CA (US)

(72) Inventors: David P. Bour, Cupertino, CA (US); Thomas R. Prunty, Santa Clara, CA (US); Hui Nie, Cupertino, CA (US); Madhan M. Raj, Cupertino, CA (US)

(73) Assignee: NEXGEN POWER SYSTEMS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/681,823

(22) Filed: Aug. 21, 2017

(65) Prior Publication Data

US 2018/0190789 A1    Jul. 5, 2018

Related U.S. Application Data

(63) Continuation of application No. 14/806,173, filed on Jul. 22, 2015, now abandoned, which is a
(Continued)

(51) Int. Cl.
*H01L 29/66* (2006.01)
*H01L 21/02* (2006.01)
(Continued)

(52) U.S. Cl.
CPC .... *H01L 29/66143* (2013.01); *H01L 21/0254* (2013.01); *H01L 21/0262* (2013.01);
(Continued)

(58) Field of Classification Search
CPC ......... H01L 29/66143; H01L 21/30612; H01L 29/66121; H01L 29/0619; H01L 21/3086;
(Continued)

(56) References Cited

U.S. PATENT DOCUMENTS 5,915,164 A * 6/1999 Taskar ............. H01L 21/28587
257/E21.407
5,920,105 A * 7/1999 Okamoto .......... H01L 21/28158
257/288
(Continued)

FOREIGN PATENT DOCUMENTS

WO        2013010829 A1    1/2013
WO    WO 2013/010829 A1 *  1/2013

OTHER PUBLICATIONS

U.S. Appl. No. 13/571,743, "Advisory Action", dated Apr. 6, 2015, 5 pages.
(Continued)

*Primary Examiner* — Bitew A Dinke
(74) *Attorney, Agent, or Firm* — Kilpatrick Townsend & Stockton LLP

(57) ABSTRACT

A method of regrowing material includes providing a III-nitride structure including a masking layer and patterning the masking layer to form an etch mask. The method also includes removing, using an in-situ etch, a portion of the III-nitride structure to expose a regrowth region and regrowing a III-nitride material in the regrowth region.

17 Claims, 18 Drawing Sheets

Related U.S. Application Data continuation of application No. 13/571,743, filed on Aug. 10, 2012, now Pat. No. 9,123,533.

(51) Int. Cl.
　　*H01L 29/872*　　(2006.01)
　　*H01L 29/06*　　(2006.01)
　　*H01L 21/306*　　(2006.01)
　　*H01L 21/308*　　(2006.01)
　　*H01L 29/868*　　(2006.01)
　　*H01L 29/20*　　(2006.01)

(52) U.S. Cl.
　　CPC .. *H01L 21/02389* (2013.01); *H01L 21/02458* (2013.01); *H01L 21/02634* (2013.01); *H01L 21/02639* (2013.01); *H01L 21/02642* (2013.01); *H01L 21/02647* (2013.01); *H01L 21/3086* (2013.01); *H01L 21/30612* (2013.01); *H01L 29/0619* (2013.01); *H01L 29/66121* (2013.01); *H01L 29/66446* (2013.01); *H01L 29/66462* (2013.01); *H01L 29/868* (2013.01); *H01L 29/872* (2013.01); *H01L 29/2003* (2013.01)

(58) Field of Classification Search
　　CPC ............. H01L 29/868; H01L 21/02634; H01L 29/872; H01L 21/0262; H01L 21/02458; H01L 21/02647; H01L 29/66446; H01L 21/02642; H01L 21/0254; H01L 29/66462; H01L 21/02389; H01L 29/2003
　　See application file for complete search history.

(56) References Cited

U.S. PATENT DOCUMENTS

| | | | |
|---|---|---|---|
| 6,600,192 B1 | 7/2003 | Sugawara et al. | |
| 7,361,576 B2 | 4/2008 | Imer et al. | |
| 7,851,825 B2 | 12/2010 | Suh et al. | |
| 8,030,638 B2 | 10/2011 | Kikkawa et al. | |
| 8,324,660 B2 | 12/2012 | Lochtefeld et al. | |
| 8,390,101 B2 | 3/2013 | Flynn et al. | |
| 8,415,219 B2 | 4/2013 | Hirler et al. | |
| 8,502,234 B2 | 8/2013 | Kizilyalli et al. | |
| 8,569,153 B2 | 10/2013 | Bour et al. | |
| 8,592,298 B2* | 11/2013 | Romano ............. H01L 29/0619 257/458 | |
| 8,659,055 B2 | 2/2014 | Okamoto et al. | |
| 8,709,921 B2 | 4/2014 | Su et al. | |
| 8,822,311 B2* | 9/2014 | Kizilyalli ............. H01L 29/868 257/472 | |
| 8,853,063 B2 | 10/2014 | Bour et al. | |
| 8,969,180 B2 | 3/2015 | Nie et al. | |
| 8,975,664 B2 | 3/2015 | Beam et al. | |
| 9,123,533 B2* | 9/2015 | Bour ................. H01L 21/02389 | |
| 9,171,751 B2 | 10/2015 | Disney et al. | |
| 9,171,937 B2 | 10/2015 | Kizilyalli et al. | |
| 9,184,305 B2 | 11/2015 | Kizilyalli et al. | |
| 2002/0115230 A1* | 8/2002 | Barber .................. H03H 3/007 438/53 | |
| 2003/0134446 A1 | 7/2003 | Koike et al. | |
| 2005/0164475 A1* | 7/2005 | Peckerar ................. C30B 25/04 438/492 | |
| 2007/0015345 A1* | 1/2007 | Baker ..................... C30B 25/02 438/481 | |
| 2007/0029573 A1* | 2/2007 | Cheng ................. H01L 29/0619 257/135 | |
| 2007/0096239 A1 | 5/2007 | Cao et al. | |
| 2007/0164306 A1* | 7/2007 | Nakahata ............ H01L 33/007 257/103 | |
| 2008/0124853 A1 | 5/2008 | Cheng et al. | |
| 2008/0173875 A1* | 7/2008 | Koshka ................ H01L 21/02378 257/77 | |
| 2008/0251793 A1* | 10/2008 | Mazzola ............. H01L 29/8611 257/77 |
| 2009/0179258 A1 | 7/2009 | Otake | |
| 2009/0189228 A1 | 7/2009 | Zhang et al. | |
| 2009/0267141 A1* | 10/2009 | Matocha ............. H01L 29/0634 257/329 | |
| 2009/0309127 A1* | 12/2009 | Raring ................... B82Y 10/00 257/103 | |
| 2010/0327318 A1 | 12/2010 | Okamoto et al. | |
| 2011/0198693 A1 | 8/2011 | Shiomi et al. | |
| 2012/0018699 A1* | 1/2012 | Chua ...................... C30B 25/02 257/13 | |
| 2012/0018758 A1* | 1/2012 | Matioli .................. B82Y 20/00 257/98 | |
| 2012/0074524 A1 | 3/2012 | Baker et al. | |
| 2012/0104359 A1 | 5/2012 | Felker et al. | |
| 2012/0119218 A1* | 5/2012 | Su .......................... C30B 25/18 257/76 | |
| 2012/0181547 A1* | 7/2012 | Flynn ..................... C30B 25/02 257/76 | |
| 2012/0280249 A1 | 11/2012 | Arena et al. | |
| 2012/0302178 A1* | 11/2012 | Beam, III ......... H01L 29/66462 455/73 | |
| 2012/0319127 A1* | 12/2012 | Chowdhury ...... H01L 29/66204 257/76 | |
| 2012/0319129 A1 | 12/2012 | Matsumoto | |
| 2013/0032812 A1* | 2/2013 | Kizilyalli ............ H01L 21/8252 257/76 | |
| 2013/0032814 A1* | 2/2013 | Bour .................... H01L 21/0254 257/76 | |
| 2013/0056731 A1 | 3/2013 | Mauder et al. | |
| 2013/0056743 A1* | 3/2013 | Bour ......................... H01L 29/32 257/76 | |
| 2013/0087835 A1* | 4/2013 | Edwards ........... H01L 29/66143 257/263 | |
| 2013/0099324 A1* | 4/2013 | Huang .............. H01L 29/66522 257/401 | |
| 2013/0126885 A1* | 5/2013 | Disney ................ H01L 21/2654 257/76 | |
| 2013/0137225 A1* | 5/2013 | Bour .................... H01L 21/0254 438/192 | |
| 2013/0143392 A1* | 6/2013 | Romano ............... H01L 29/475 438/478 | |
| 2013/0143394 A1 | 6/2013 | Faurie et al. | |
| 2013/0146886 A1* | 6/2013 | Disney ................... H01L 29/402 257/76 | |
| 2013/0161633 A1* | 6/2013 | Nie .................... H01L 29/66204 257/76 | |
| 2013/0161780 A1* | 6/2013 | Kizilyalli .............. H01L 29/868 257/488 | |
| 2013/0164893 A1 | 6/2013 | Romano et al. | |
| 2013/0292686 A1* | 11/2013 | Kizilyalli .......... H01L 29/66446 257/76 | |
| 2014/0045306 A1 | 2/2014 | Bour et al. | |
| 2014/0159119 A1* | 6/2014 | Derluyn ............ H01L 29/66462 257/194 | |
| 2014/0206179 A1* | 7/2014 | Nie .................... H01L 29/66204 438/478 | |
| 2015/0129886 A1* | 5/2015 | Aktas ................... H01L 29/7802 257/76 | |
| 2015/0132899 A1 | 5/2015 | Kizilyalli et al. | |
| 2016/0190276 A1* | 6/2016 | Bour ................. H01L 21/02389 438/492 | |

OTHER PUBLICATIONS

U.S. Appl. No. 13/571,743, "Final Office Action", dated Dec. 31, 2014, 37 pages.
U.S. Appl. No. 13/571,743, "Non Final Office Action", dated Jul. 16, 2013, 26 pages.
U.S. Appl. No. 13/571,743, "Non-Final Office Action", dated Apr. 9, 2013, 28 pages.
U.S. Appl. No. 13/571,743, "Non-Final Office Action", dated Jul. 14, 2014, 39 pages.
U.S. Appl. No. 13/571,743, "Notice of Allowance", dated Apr. 22, 2015, 8 pages.

(56) References Cited

OTHER PUBLICATIONS

U.S. Appl. No. 14/806,173, "Final Office Action", dated Feb. 21, 2017, 23 pages.
U.S. Appl. No. 14/806,173, "Non-Final Office Action", dated Apr. 19, 2016, 27 pages.

* cited by examiner

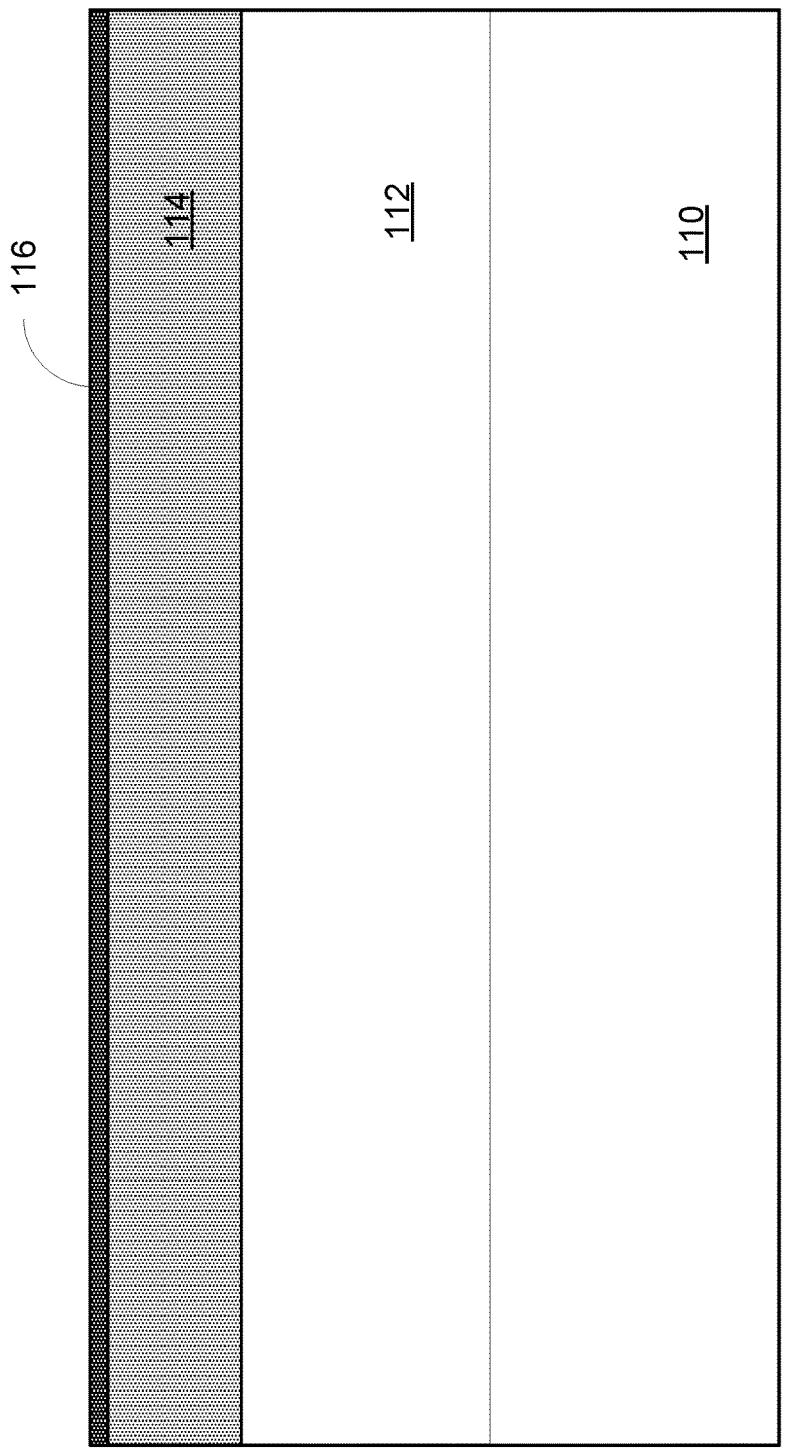

METHOD AND SYSTEM FOR IN-SITU ETCH AND REGROWTH IN GALLIUM NITRIDE BASED DEVICES

CROSS-REFERENCE TO RELATED APPLICATIONS

This application is a continuation of U.S. patent application Ser. No. 14/806,173, filed on Jul. 22, 2015; which is a continuation of U.S. patent application Ser. No. 13/571,743, filed on Aug. 10, 2012, now U.S. Pat. No. 9,123,533, issued on Sep. 1, 2015. The disclosures of which are hereby incorporated by reference.

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to methods and systems for fabricating electronic devices using in-situ etch and regrowth processes. Merely by way of example, the invention has been applied to GaN-based diodes and transistors with regrown regions formed using an in-situ etch, improving the reliability and performance associated with the regrowth interfaces. The methods and techniques can be applied to a variety of compound semiconductor systems including diodes and transistors.

According to an embodiment of the present invention, a method of regrowing material is provided. The method includes providing a III-nitride structure including a masking layer and patterning the masking layer to form an etch mask. The method also includes removing, using an in-situ etch, a portion of the III-nitride structure to expose a regrowth region and regrowing a III-nitride material in the regrowth region.

According to another embodiment of the present invention, a method of fabricating an MPS diode is provided. The method includes providing a III-nitride structure including a substrate characterized by a first conductivity type, a first epitaxial layer coupled to the substrate and characterized by the first conductivity type, a second epitaxial layer coupled to the first epitaxial layer and characterized by a second conductivity type, and a masking layer coupled to the second epitaxial layer. The method also includes patterning the masking layer to form an etch mask, placing the III-nitride structure in a growth chamber, and removing a portion of the second epitaxial layer and a portion of the first epitaxial layer to expose a regrowth region. The method further includes regrowing a III-nitride material in the regrowth region, removing the regrown structure from the growth chamber, and removing a portion of the regrown III-nitride material to expose the second epitaxial layer. Additionally, the method includes forming a Schottky contact to the regrown III-nitride material, forming an ohmic contact to portions of the second epitaxial layer, and forming a second ohmic contact to the substrate.

According to an alternative embodiment of the present invention, a method of fabricating an electronic device is provided. The method includes providing a III-nitride structure including a substrate, one or more III-nitride epitaxial layers, and a masking layer, patterning the masking layer to form an etch mask, and placing the III-nitride structure in a growth reactor. The method also includes removing a portion of the one or more III-nitride epitaxial layers to expose a regrowth region, regrowing a III-nitride material in the regrowth region, and removing the III-nitride structure from the growth reactor. The method further includes forming a first contact structure to the substrate and forming a second contact structure to the regrown III-nitride material.

According to another alternative embodiment of the present invention, a method of fabricating a VJFET is provided. The method includes providing a III-nitride structure including a III-nitride substrate characterized by a first conductivity type, a first III-nitride epitaxial layer coupled to the substrate and characterized by the first conductivity type, a second III-nitride epitaxial layer coupled to the first epitaxial layer and characterized by the first conductivity type, and a masking layer. A doping concentration of the second epitaxial layer is higher than a doping concentration of the first epitaxial layer. The method also includes patterning the masking layer to form an etch mask, placing the III-nitride structure in a growth reactor, and removing a portion of the one or more III-nitride epitaxial layers to expose a plurality of regrowth regions. The method further includes regrowing a III-nitride material having a second conductivity type in at least the plurality of regrowth regions, removing the III-nitride structure from the growth reactor, and removing a portion of the regrown III-nitride material and the etch mask to expose regrown gate regions and portions of the second III-nitride epitaxial layer. Additionally, the method includes forming a drain contact structure electrically connected to the substrate, forming gate contact structures electrically connected to the regrown gate regions, and forming source contact structures electrically connected to the portions of the second III-nitride epitaxial layer.

Numerous benefits are achieved by way of the present invention over conventional techniques. For example, embodiments of the present invention provide regrowth interfaces characterized by reduced leakage in comparison with ex-situ etched structures. Additionally, embodiments of the present invention provide more reproducible, higher-yield fabrication processes for electronic devices. These and other embodiments of the invention along with many of its advantages and features are described in more detail in conjunction with the text below and attached figures.

BRIEF DESCRIPTION OF THE DRAWINGS

FIGS. 1A-1F are simplified process flow diagrams illustrating a process for forming a merged p-i-n Schottky (MPS) diode according to an embodiment of the present invention;

DETAILED DESCRIPTION OF SPECIFIC EMBODIMENTS

Embodiments of the present invention relate to electronic devices. More specifically, the present invention relates to methods and systems for fabricating electronic devices using in-situ etch and regrowth processes. Merely by way of example, the invention has been applied to GaN-based diodes and transistors with regrown regions formed using an in-situ etch, improving the reliability and performance associated with the regrowth interfaces. The methods and techniques can be applied to a variety of compound semiconductor systems including diodes and transistors.

Some III-nitride devices form p-n junctions during the epitaxial growth process as materials with differing conductivity types are epitaxially grown. This can be achieved, for example, by introducing a precursor of a p-type dopant species during growth of a layer immediately over the surface of an n-type layer, providing an interface/junction that is substantially planar and horizontal. Accordingly, the p-n junction can be referred to as a vertical p-n junction.

The performance and reliability of electronic and opto-electronic devices may be improved by the formation of lateral p-n junctions in which the growth interface is substantially vertical. However, the high temperatures utilized in some semiconductor doping processes, including diffusion or implantation, present difficult issues related to performing such semiconductor doping processes in III-nitride based materials including GaN. Thus, embodiments of the present invention provide in-situ etch and regrowth processes that allow for the formation of lateral p-n junctions in III-nitride materials including GaN.

As described more fully throughout the present specification, a number of fundamental device structures benefit from the processes provided by embodiments of the present invention. Just by way of example, devices that can benefit from the processes described herein include merged p-i-n Schottky (MPS) diodes and vertical junction field effect transistors (VJFETs) as well as more basic electronic device structures such as Schottky diodes, p-n junction diodes, and the like. Thus, both two-terminal devices (diodes) and three-terminal devices (transistors), such as field effect transistors, can benefit from the processed described herein.

Figure 1B:
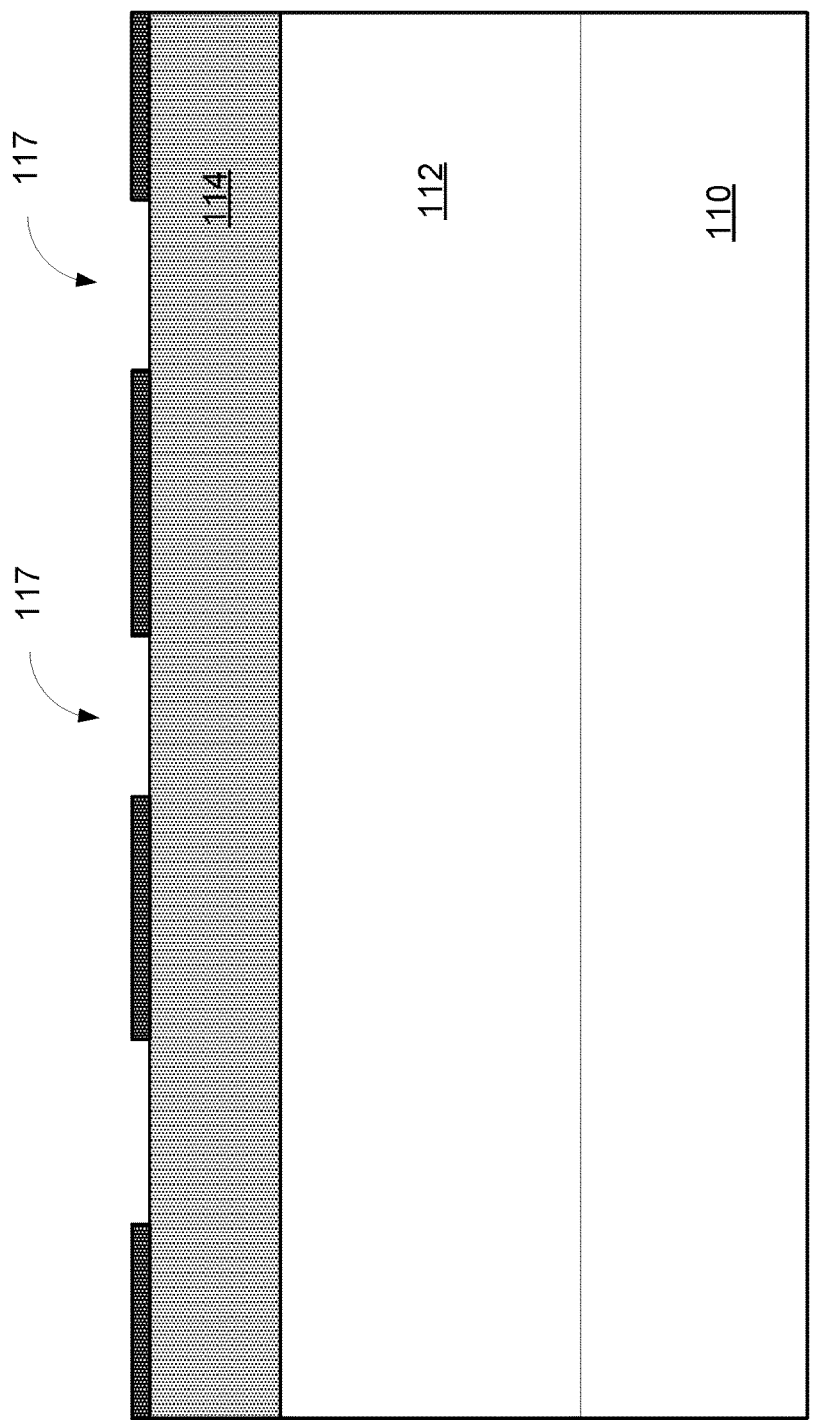

FIGS. 1A-1F are simplified process flow diagrams illustrating a process for forming a merged p-i-n Schottky (MPS) diode according to an embodiment of the present invention. As illustrated in FIG. 1A, a III-nitride structure includes an n-type III-nitride substrate 110 that provides a growth surface for an n-type epitaxial layer 112, for example, a lightly doped n-type GaN epitaxial layer deposited on a GaN substrate. A p-type III-nitride epitaxial layer 114 is then deposited on the n-type epitaxial layer. In the illustrated embodiment, the p-type III-nitride epitaxial layer 114 is a heavily doped p-type GaN layer.

The III-nitride substrate 110 can be a pseudo-bulk GaN material on which a GaN epitaxial layer is grown. Dopant concentrations (e.g., doping density) of the III-nitride substrate 110 can vary, depending on desired functionality. For example, the III-nitride substrate 110 can have an n+ conductivity type, with dopant concentrations ranging from $1 \times 10^{17}$ cm$^{-3}$ to $1 \times 10^{19}$ cm$^{-3}$ and Although the III-nitride substrate 110 is illustrated as including a single material composition (e.g., GaN), multiple layers can be provided as part of the substrate. Moreover, adhesion, buffer, and other layers (not illustrated) can be utilized during the epitaxial growth process. One of ordinary skill in the art would recognize many variations, modifications, and alternatives.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIG. 1A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

Referring to FIG. 1A, a first III-nitride epitaxial layer 112 is formed on the III-nitride substrate 110 and has the same conductivity type as the substrate. The properties of the first III-nitride epitaxial layer 112 can also vary, depending on desired functionality. The first III-nitride epitaxial layer 112 can serve as a drift layer for the Schottky region(s) of the MPS diode and an intrinsic component for the p-i-n junction(s) of the MPS diode. Thus, the first III-nitride epitaxial layer 112 can be a relatively low-doped material. For example, the first III-nitride epitaxial layer 112 can have an n− conductivity type, with dopant concentrations ranging from $1 \times 10^{14}$ cm$^{-3}$ to $1 \times 10^{18}$ cm$^{-3}$. Furthermore, the dopant concentration can be uniform or can vary, for example, as a function of the thickness of the drift region.

The thickness of the first III-nitride epitaxial layer 112 can also vary substantially, depending on the desired functionality. As discussed above, homoepitaxial growth can enable the first III-nitride epitaxial layer 112 to be grown far thicker than layers formed using conventional methods. In general, in some embodiments, thicknesses can vary between 0.5 μm and 100 μm, for example. In other embodiments thicknesses are greater than 5 Resulting breakdown voltages for the MPS diode can vary depending on the embodiment. Some embodiments provide for breakdown voltages of at least 100V, 300V, 600V, 1.2 kV, 1.7 kV, 3.3 kV, 5.5 kV, 13 kV, or 20 kV.

The p-type III-nitride epitaxial layer 114 illustrated in FIG. 1A has a different conductivity type than the first III-nitride epitaxial layer 112 and will be used to form the p-i-n structures of the MPS diode. In the illustrated embodiment, for example, the p-type III-nitride epitaxial layer 114 have a p+ conductivity type and the first III-nitride epitaxial layer 112 has an n− conductivity type. The dopant concentration of the p-type III-nitride epitaxial layer 114 can be relatively high, for example in a range from about $1 \times 10^{17}$ cm$^{-3}$ to about $2 \times 10^{20}$ cm$^{-3}$. Additionally, the dopant concentration of the p-type III-nitride epitaxial layer 114 can be uniform or non-uniform as a function of thickness.

Different dopants can be used to create n- and p-type III-nitride epitaxial layers and structures disclosed herein. For example, n-type dopants can include silicon, oxygen, or the like. P-type dopants can include magnesium, beryllium, zinc, or the like.

Referring to FIG. 1A, the III-nitride structure also includes a masking layer 116, which includes a material that will survive the reactor environment during regrowth. Thus, embodiments of the present invention utilize materials such as AlN for the masking layer 116 that are stable and inert in the reactor environment, which is a high temperature environment. In addition to AlN, other materials with suitable high temperate properties can be utilized including, without limitation, dielectrics such as silicon oxides ($Si_xO_y$), silicon nitrides ($Si_xN_y$), silicon oxynitrides (SiON), aluminum silicon oxides (AlSiO), aluminum oxides (AlO), refractory metals such as W, Mo, Re, Ta, etc., combinations thereof, and the like.

The formation of the masking layer 116 can include an epitaxial growth process in which, for example, an AlN layer is epitaxially grown and/or metamorphically grown on the second epitaxial layer 114 during the same growth run, providing a high quality AlN epitaxial layer. In some implementations, an epitaxially grown, single crystal AlN layer can be characterized by a thickness less than 10 nm, for example, between 1 nm and 6 nm, for instance between 3 nm and 4 nm, to prevent cracking of the AlN film resulting from tensile stress. Thus, embodiments of the present invention utilize masking layers of AlN that are thick enough to provide continuous layers free of pinholes and thin enough to prevent substantial cracking. The thickness of an AlN masking layer may be increased by augmenting a thin epitaxial layer (e.g., thickness of 2 nm-4 nm, typically limited by cracking caused by tensile stress) with a thicker metamorphic layer, or by incorporating a thick metamorphic layer by itself. A metamorphic AlN layer may be grown arbitrarily thick. One of ordinary skill in the art would recognize many variations, modifications, and alternatives.

Additionally, the formation of the masking layer 116 can include a deposition process in which, for example, AlN is deposited using a sputtering or other suitable deposition process. Using such sputtering techniques may enable the use of thicker AlN layers than available using epitaxial growth techniques. Thus, the masking layer can be a crystalline (e.g., single crystal), polycrystalline, or amorphous layer, or can include combinations thereof. As will be discussed in relation to FIGS. 1D, 2 and 3 below, the regrowth processes will typically produce different structures depending on the crystalline characteristics of the masking layer.

In some implementations, a combination of epitaxial growth to provide a high quality crystalline AlN layer and either low temperature epitaxial growth of a metamorphic AlN material or sputtering of an amorphous AlN material can be used to provide a layer with varying crystallographic characteristics as a function of thickness, providing a high density film adjacent the epitaxial layers and relaxation of the AlN film as the thickness increases.

Referring to FIG. 1B, the masking layer is patterned to open areas 117 of the masking layer and to expose portions of the second epitaxial layer 114. The patterning can be performed ex-situ using a wet chemical etch, a physical etch, combinations thereof, or the like. For AlN masking layers, a physical etch is typically utilized as a result of the resistance of AlN to chemical etch processes. Tetramethylammonium hydroxide (TMAH) and similar basic solutions may be used to wet-etch AlN, depending on the structural quality of the AlN. As will be evident to one of the skill in the art, the geometry of the masking layer after patterning will be dependent on the device geometry of the finished device, in this example, stripes extending into the plane of the figure to provide areas including the exposed portions of the second epitaxial layer interspersed with regrown areas as described more fully below. The patterned masking layer illustrated in FIG. 1B can be referred to as an in-situ etch mask.

Figure 1C:
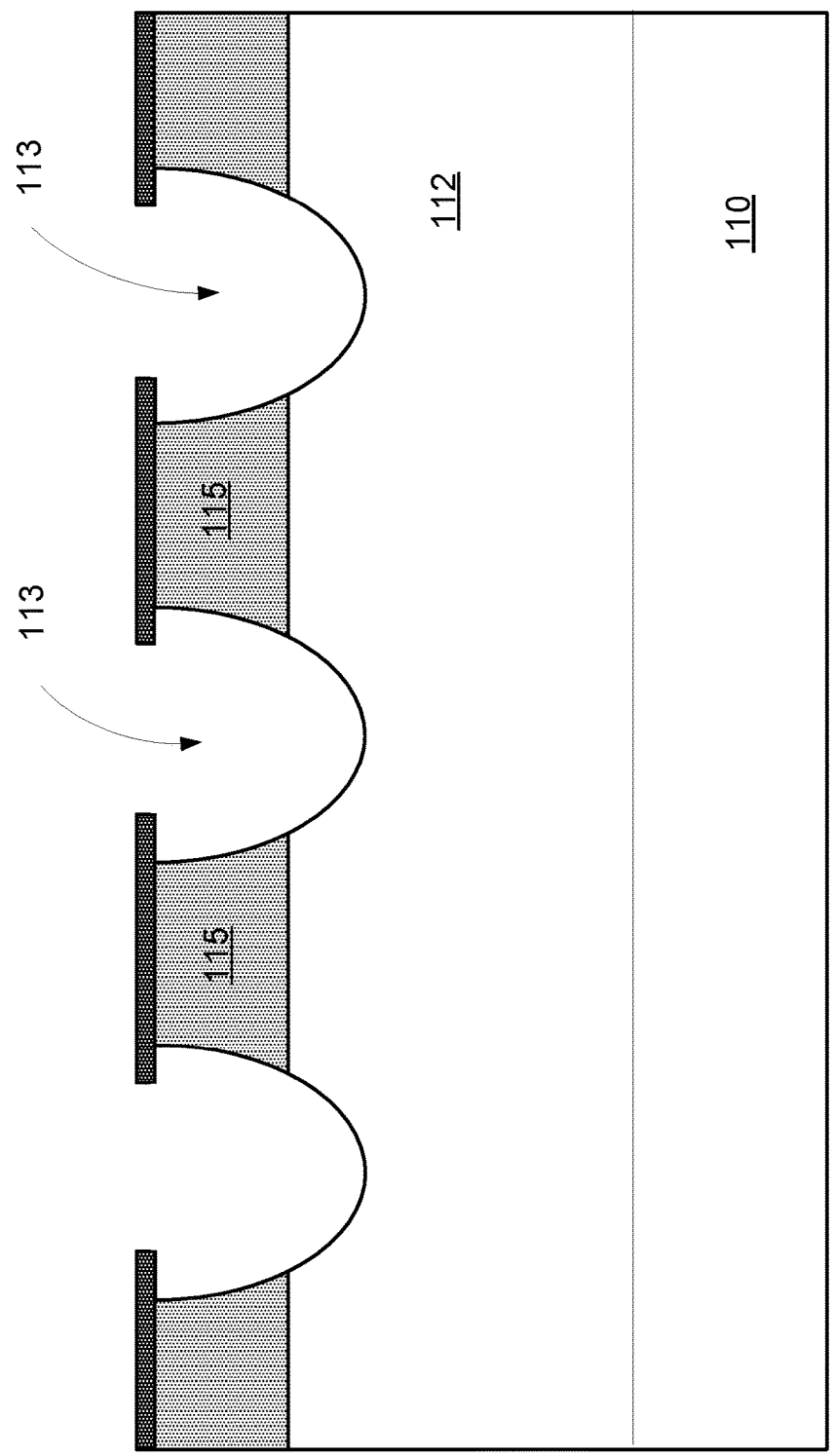

Referring to FIG. 1C, an in-situ etch is performed to remove portions of the second epitaxial layer and portions of the first epitaxial layer (illustrated by cavities 113), leaving remaining portions 115 of the second epitaxial layer. The etch process illustrated in FIG. 1C is performed in the growth reactor that is subsequently used for epitaxial regrowth, providing higher quality interfaces than produced using an ex-situ etch process. In an embodiment, the in-situ etch is performed in a high temperature, hydrogen rich environment, which is suitable for the removal of the III-nitride epitaxial layers, particularly p-type and n-type GaN. The thermal stability of the masking layer (e.g., AlN) in comparison with other epitaxial materials (e.g., GaN) enables the etch mask to remain during the in-situ etching process as illustrated by the stability of the in-situ etch mask in FIG. 1C. The hydrogen rich environment will typically also include the use of ammonia or other suitable nitrogen source during the in-situ etch to stabilize the III-nitride material and prevent the decomposition of the semiconductor materials into metallic portions (e.g., gallium metal produced by the preferential evaporation of nitrogen).

As an example, the temperature during the in-situ etch can range from about 1020° C. to about 1080° C., for instance about 1040° C.-1050° C. Thus, the in-situ etch temperature can be in the range used for epitaxial growth of III-nitride epitaxial layers. Gas flow rates can be, for example, about 5 standard liters per minute (slm) of $NH_3$ and about 20 slm of $H_2$. These temperature and flow rates are only provided by way of example and other suitable conditions can be utilized for the in-situ etch. Thus, the flow rate of ammonia may be decreased or increased in relation to the flow rate of hydrogen while still stabilizing the III-nitride materials and preventing decomposition to provide a suitable regrowth interface during subsequent processing.

As illustrated in FIG. 1C, an isotropic etch undercutting the portions of the masking layer remaining after the ex-situ etch of this layer is illustrated. However, embodiments of the present invention are not limited to isotropic etch processes during the illustrated in-situ etch and some measure of anisotropy can be observed during some etch processes. Thus, the orientation of the in-situ etch mask can impact the etch results in some embodiments. The etch extends into the first epitaxial layer 112, removing material of both conductivity types. In some embodiments, the etch rate of the in-situ etch ranges from about 0.1 μm/hour to about 0.2 μm/hour although these etch rates are not required and lesser and greater etch rates can be utilized. Additionally, the etch rate could be enhanced in some embodiments by adding corrosive species such as halogen-containing species. One of ordinary skill in the art would recognize many variations, modifications, and alternatives.

Figure 1D:
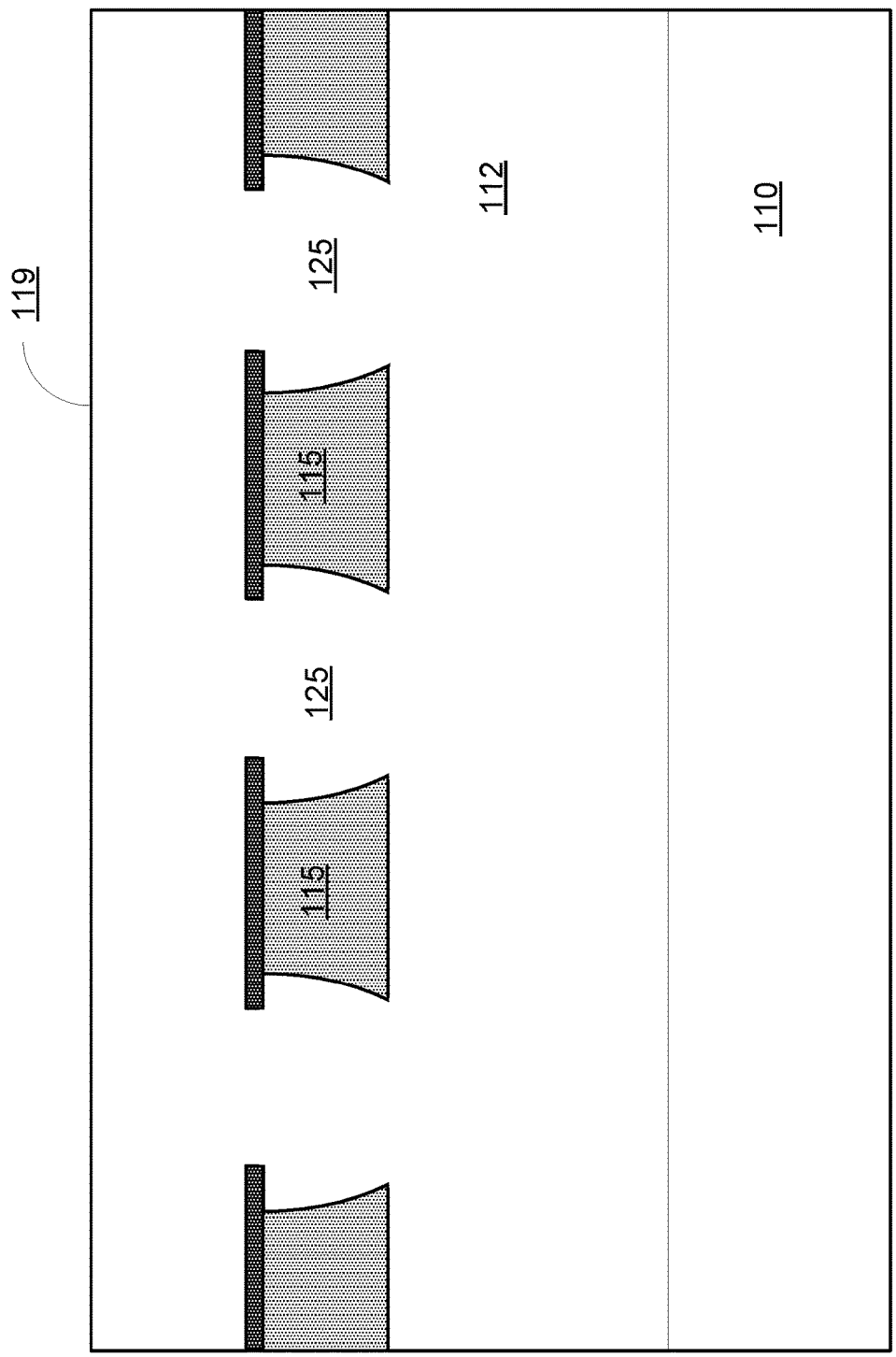

As illustrated in FIG. 1D, an epitaxial regrowth process is performed in the growth reactor without the exposure to atmosphere, which is characteristic of an ex-situ etch followed by regrowth. By modifying the etch parameters used in the previous etch process, regrowth can be initiated, for example, by introducing Group III precursors and increasing the relative flow rate of the nitrogen source (e.g., ammonia).

In the illustrated embodiments, the growth reactor is a metal-organic chemical vapor deposition (MOCVD) reactor utilizing metal-organic precursors such as trimethyl gallium (TMG), trimethyl aluminum (TMA), nitrogen sources such as ammonia, and the like.

The regrowth process illustrated in FIG. 1D regrows III-nitride material in regions 125 (e.g., n-type GaN) on the exposed portion of the n-type first epitaxial layer and the exposed sidewalls of the remaining portions 115 of the second epitaxial layer (e.g., p-type GaN). As will be evident to one of skill in the art, the substantially vertical interface between the remaining portions of the second epitaxial layer and the regrown material is a critical interface in some devices. The in-situ etch and regrowth processes illustrated in FIGS. 1C and 1D, respectively, provide benefits not available using ex-situ etch processes. For example, the illustrated process is substantially free of the use of chemical etch processes, rinse processes, subsequent air exposure, and the like. By performing in-situ etch in the reactor, chemical byproducts produced during the chemical etch and rinse process are reduced or eliminated, providing an improved regrowth surface and resulting higher device performance. It should be noted that although a planarizing regrowth (i.e., planar regrowth surface 119) is illustrated in FIG. 1D, this is not required by the present invention and some non-planar surface structure can be associated with the top of the regrown material.

Figure 1E:
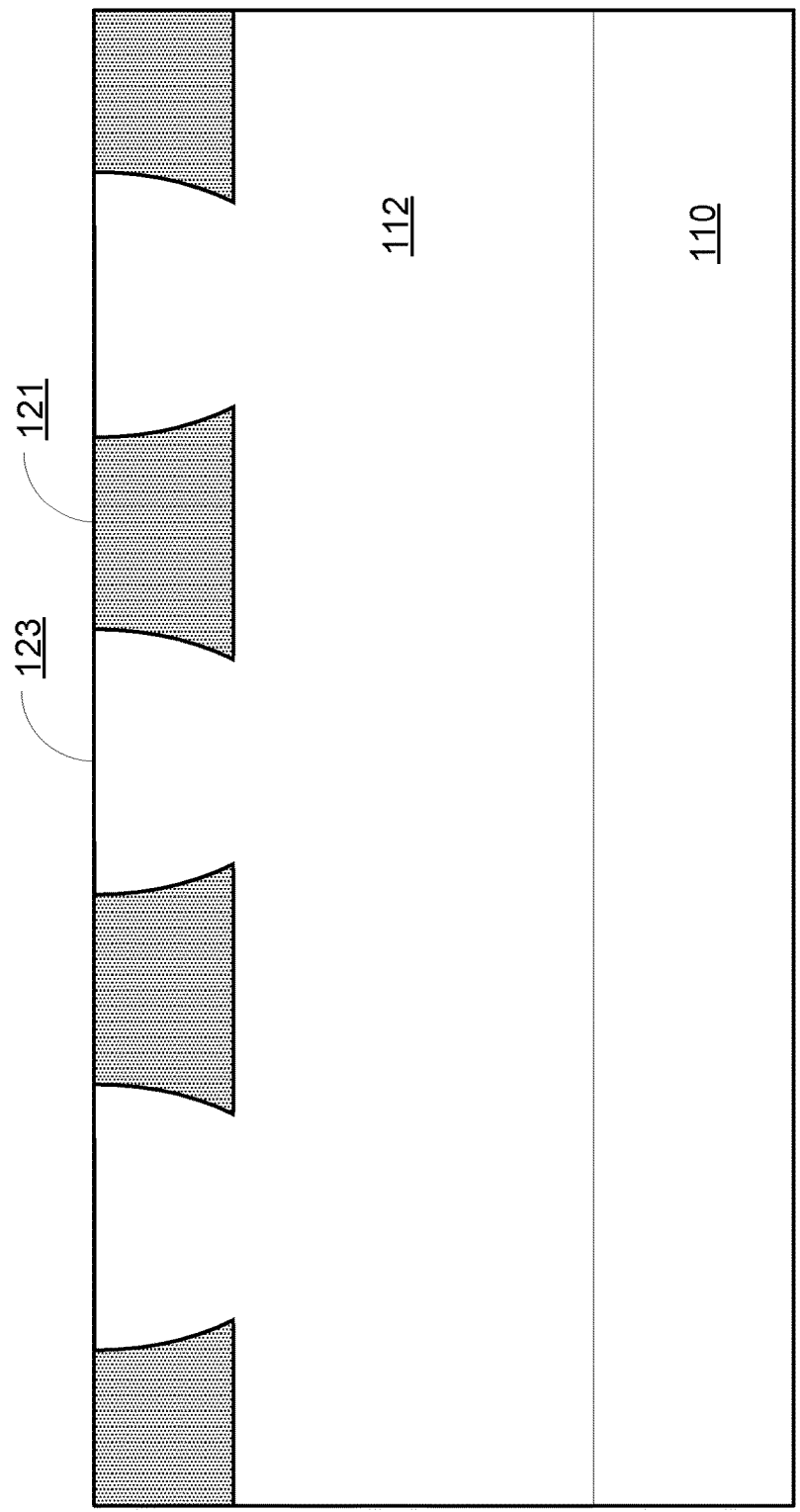

FIG. 1E illustrates the use of an etch process to remove regrown material and the in-situ etch mask to expose portions 121 of the second epitaxial layer and portions 123 of the material regrown on the first epitaxial layer. The material removal process illustrated in FIG. 1E is typically performed using a physical etch process external to the growth reactor but can also include chemical-mechanical polishing (CMP) processes in combination with etching processes.

In some embodiments, photo-enhanced chemical etching is used as a method of selectively etching regrown GaN materials and substantially terminating the etch process when the AlN layer is reached during etching. Photo-enhanced chemical etching of GaN can achieve etch rates as high as 50 nm/min using a KOH solution and a mercury arc lamp illumination filtered at 365 nm. The absorption of light by the GaN results in the creation of hole electron pairs, which contribute carriers used in the etching process. In contrast with GaN, the absorption edge for AlN is near 200 nm, resulting in negligible absorption at wavelengths between 200 nm and 365 nm. Below the band edge, the absorption for AlN is negligible <200 cm$^{-1}$. Additional description related to photo-enhanced etching is provided in U.S. patent application Ser. No. 13/299,227, filed Nov. 17, 201, entitled "Aluminum Gallium Nitride Etch Stop Layer for Gallium Nitride Bases Devices," the disclosure of which is hereby incorporated by reference in its entirety for all purposes. In some embodiments, an absorption coefficient of the AlN masking layer at wavelengths associated with electromagnetic radiation used during an etching process is less than 1,000 cm'.

Therefore, by selecting a wavelength of illumination light less than 365 nm, the etching of GaN proceeds, but since the AlN is transparent to the illumination light, the etching process stops when the AlN surface is reached, thereby resulting in an AlN etch stop layer. The wavelength of light used during the photo-enhanced chemical etching process can be varied depending on the materials in the structure. A physical etch or other suitable etch could then be used to remove the AlN layer.

Figure 1F:
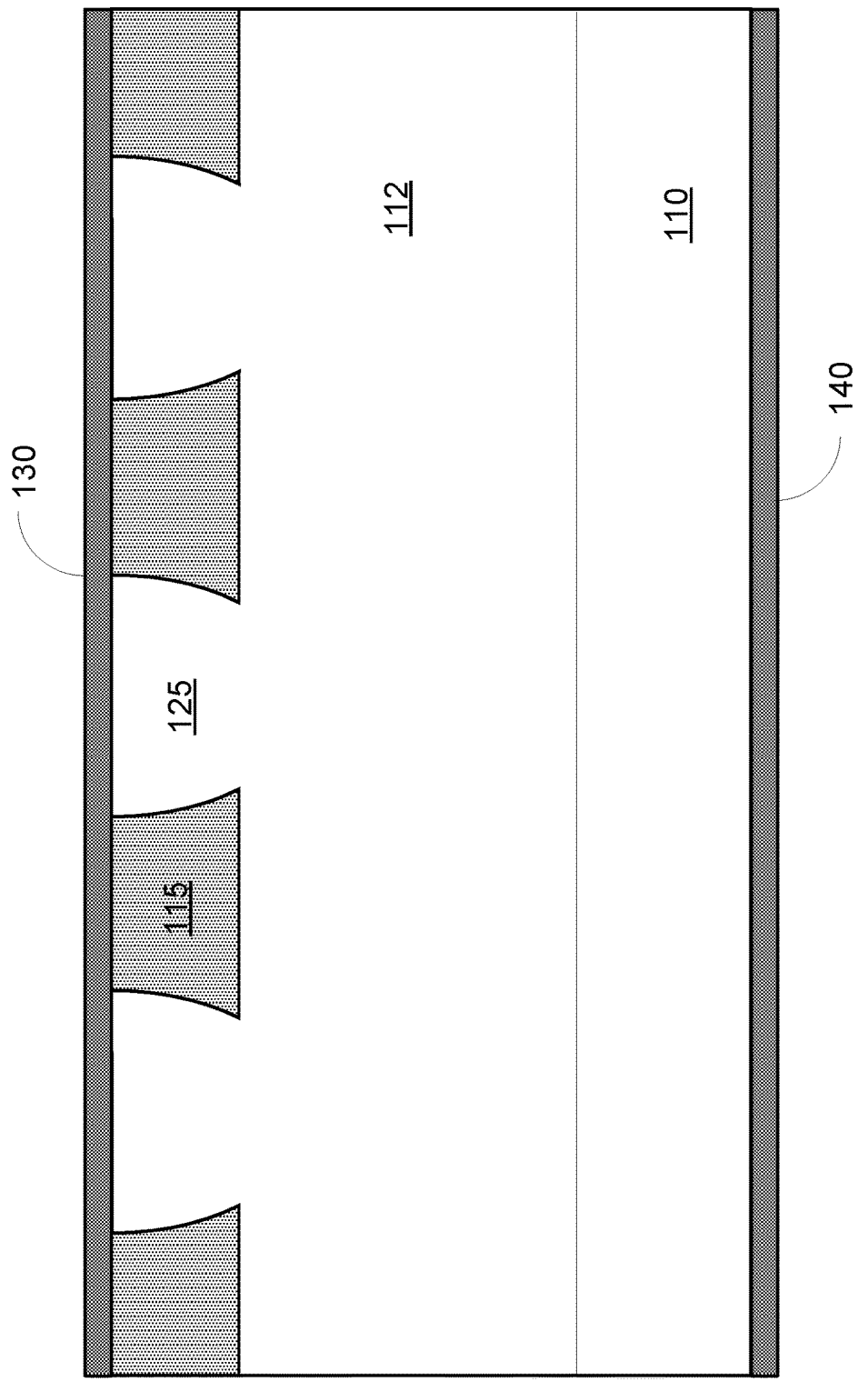

FIG. 1F illustrates formation of a first electrical contact 130 to the exposed portions of the second epitaxial layer and exposed portions of the regrown material and formation of a second electrical contact 140 to the substrate. In the MPS diode structure illustrated in FIG. 1F, the first electrical contact 130 forms a Schottky contact to the n-type material (i.e., regrown n-type material) and an ohmic contact to the second epitaxial layer (i.e., p-type material).

The first electrical contact 130 is in electrical contact with regrown regions 125 as well as remaining portions 115 of the second epitaxial layer. The first electrical contact 130, which can also be referred to as a contact metal structure, can include one or more layers of metal and/or alloys to create a Schottky barrier with the regrown regions 125 (e.g., regrown n-type GaN epitaxial material), which have a relatively low dopant concentration. On the other hand, the first electrical contact 130 can form an ohmic contact with the remaining portions 115 of the second epitaxial layer (e.g., p-type GaN), which can have a relatively high dopant concentration, forming the p-i-n portions of the MPS diode. Remaining regions (not shown) can provide junction extension and/or edge termination for the MPS diode. The first electrical contact 130 can be formed using a variety of techniques, including lift-off and/or deposition with subsequent etching, which can vary depending on the metals used. In some embodiments, the first electrical contact 130 can include Nickel, Platinum, Palladium, Silver, Gold, and the like.

The second electrical contact 140 can include one or more layers of ohmic metal that serve as a contact for the cathode of the MPS diode. For example, the second electrical contact 140 can comprise a titanium-aluminum (Ti/Al) ohmic metal. Other metals and/or alloys can be used including, but not limited to, aluminum, nickel, gold, combinations thereof, or the like. In some embodiments, an outermost metal of the second electrical contact 140 can include gold, tantalum, tungsten, palladium, silver, or aluminum, combinations thereof, and the like. The second electrical contact 140 can be formed using any of a variety of methods such as sputtering, evaporation, or the like. Additional description related to fabrication and operation of MPS diodes is provided in U.S. patent application Ser. No. 13/270,625, filed on Oct. 11, 2011 and entitled "Method of Fabricating a GaN Merged P-I-N Schottky (MPS) Diode," the disclosure of which is hereby incorporated by reference in its entirety for all purposes.

Figure 2:
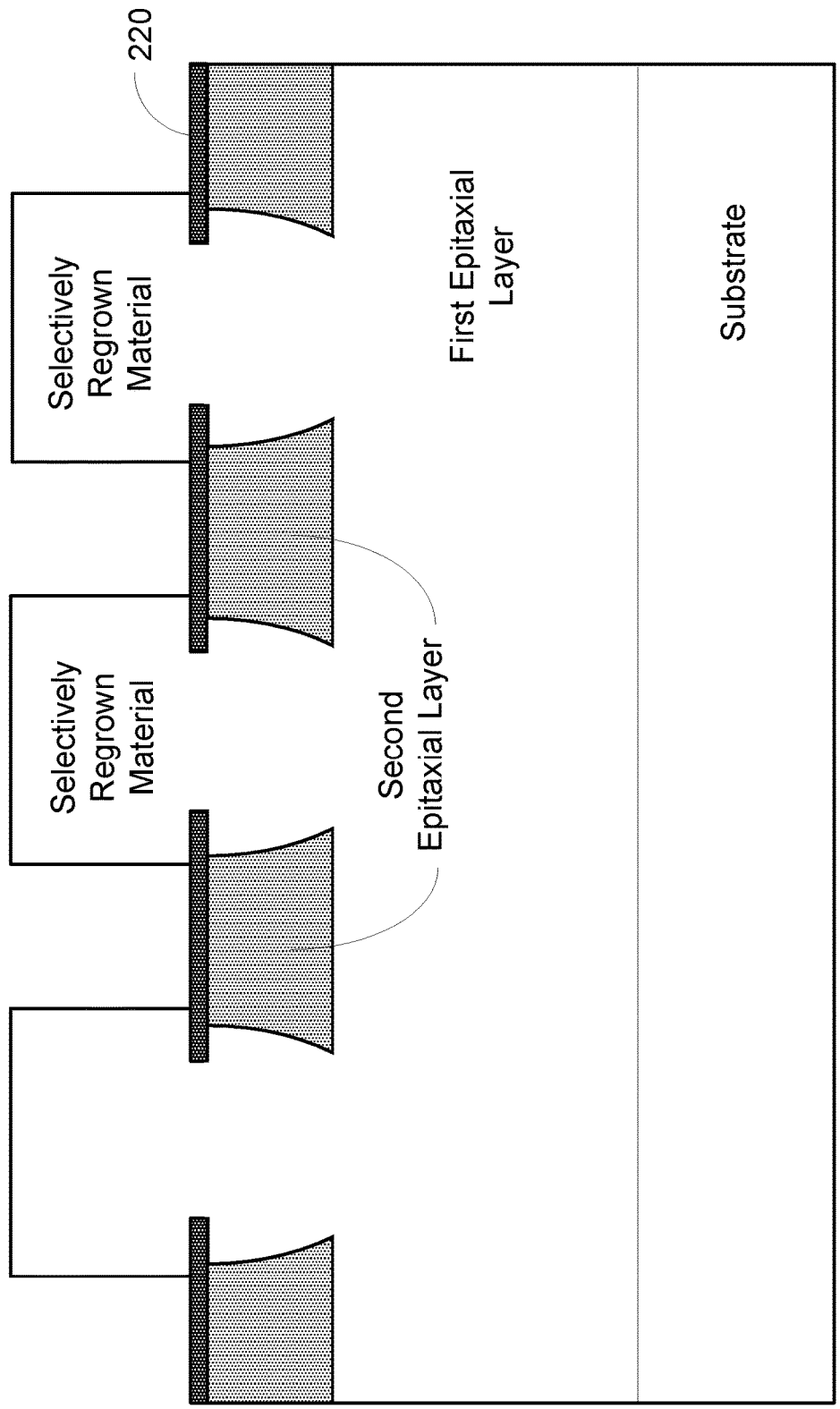
FIG. 2 is a simplified process flow diagram illustrating a selective regrowth alternative to the process flow illustrated in FIG. 1D.

FIG. 2 is a simplified process flow diagram illustrating a selective regrowth alternative to the process flow illustrated in FIG. 1D. In the variation illustrated in FIG. 2, a mask material 220 is utilized that has regrowth inhibition properties, resulting in selective regrowth, with the majority of the regrowth occurring over the exposed portions of the first epitaxial layer and minimal regrowth over the masking layer. The mask material illustrated in FIG. 2 can be deposited in-situ in the growth reactor along with the epitaxial layers or can be deposited or otherwise formed ex-situ. An example of a mask suitable for the process illustrated in FIG. 2 is a SiON mask although embodiments of the present invention are not limited to this masking material.

Figure 3:
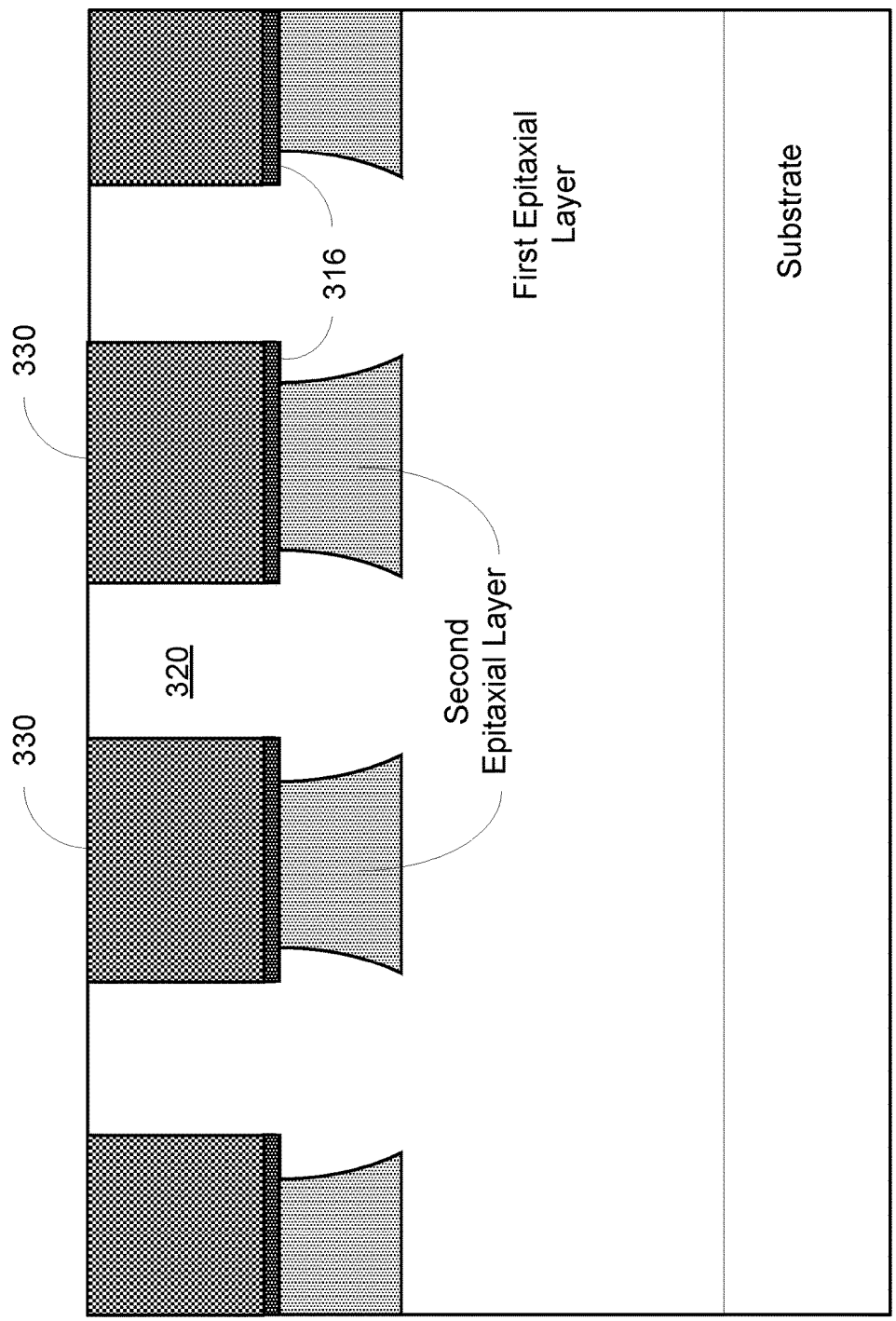
FIG. 3 is a simplified process flow diagram illustrating another regrowth alternative to the process flow illustrated in FIG. 1D.

FIG. 3 is a simplified process flow diagram illustrating another regrowth alternative to the process flow illustrated in FIG. 1D. In the variation illustrated in FIG. 3, the masking layer 316 includes an amorphous material (e.g., sputtered AlN) and the regrowth of the III-nitride material is substantially single crystal in the portions 320 above the exposed regions of the first epitaxial layer and amorphous, metamorphic, polycrystalline, combinations thereof, or the like, in the portions 330 above the in-situ etch mask. Thus, the structure illustrated in FIG. 3 includes both epitaxial and non-epitaxial regrowth regions. In order to form the masking layer 316, a metamorphic layer can be formed at temperatures lower than the regrowth temperature, for example, about 700° C.-900° C., providing a thicker layer than that illustrated in FIG. 1A. As illustrated in FIG. 1E, some device structures remove all material above and including the masking layer, resulting in removal of the non-epitaxial material at portions 330 during subsequent processing.

FIGS. 4A-4F are simplified process flow diagrams illustrating a process for forming a vertical junction field effect transistor (VJFET) according to an embodiment of the present invention. The structures and processes illustrated in FIGS. 4A-4F share some commonalities with the structures and processes illustrated in FIGS. 1A-1F and description provided in relation to the previous embodiments is applicable to the following embodiments as appropriate.

Figure 4A:
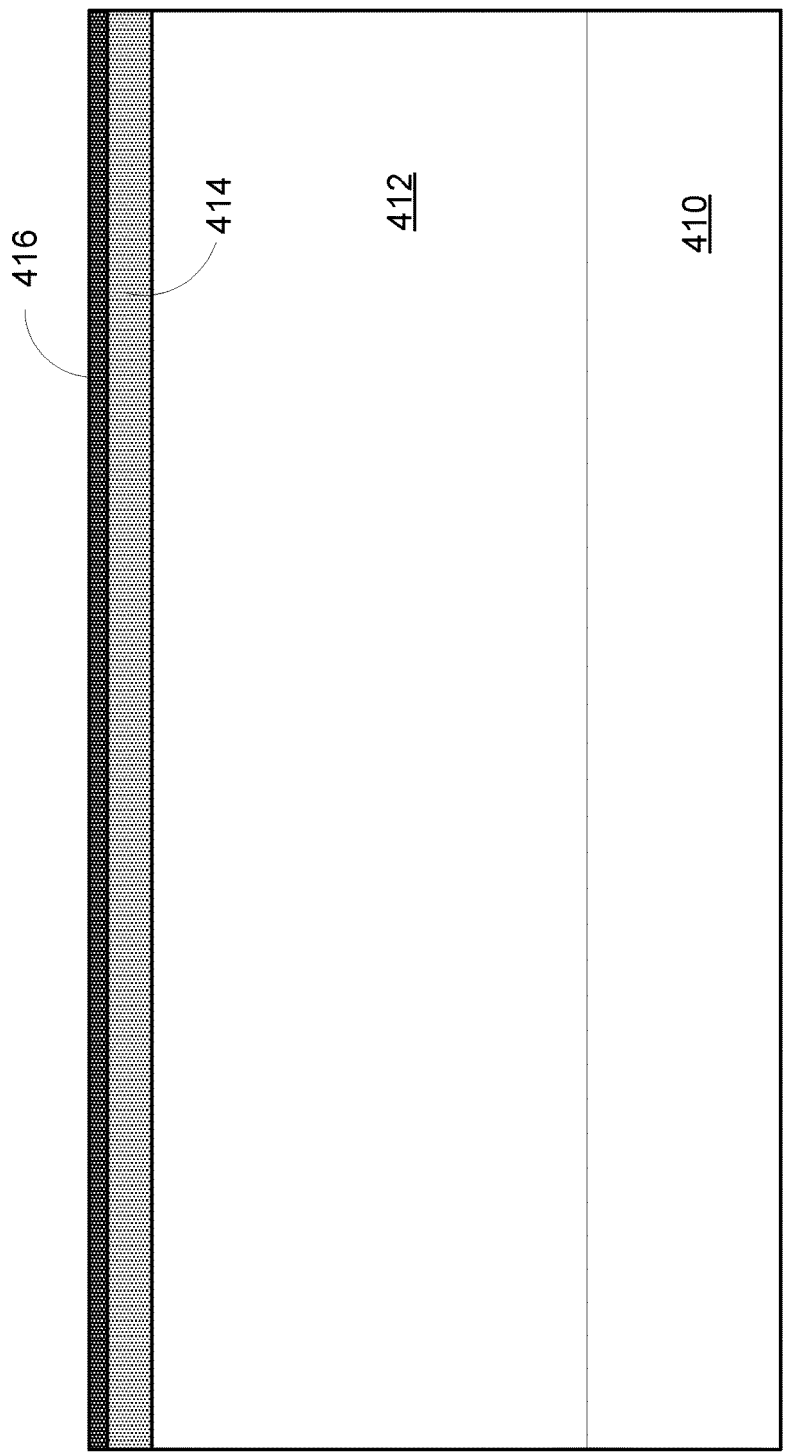
FIGS. 4A-4F are simplified process flow diagrams illustrating a process for forming a vertical junction field effect transistor (VJFET) according to an embodiment of the present invention.

FIG. 4A illustrates a III-nitride structure including a III-nitride substrate 410, a first III-nitride epitaxial layer 412, a second epitaxial layer 414, and a masking layer 416. In a particular embodiment, the III-nitride substrate 410 comprises a n-type GaN substrate, the first III-nitride epitaxial layer 412 comprises a lightly doped n-type GaN layer, the second epitaxial layer 414 comprises a heavily doped n-type GaN layer, and the masking layer 416 comprises an AlN layer, which is characterized by a greater thermal stability that some other III-nitride materials. Elements of the III-nitride structure can be grown in a single growth run or can be formed in separate growth runs, including non-epitaxial deposition processes.

Figure 4B:
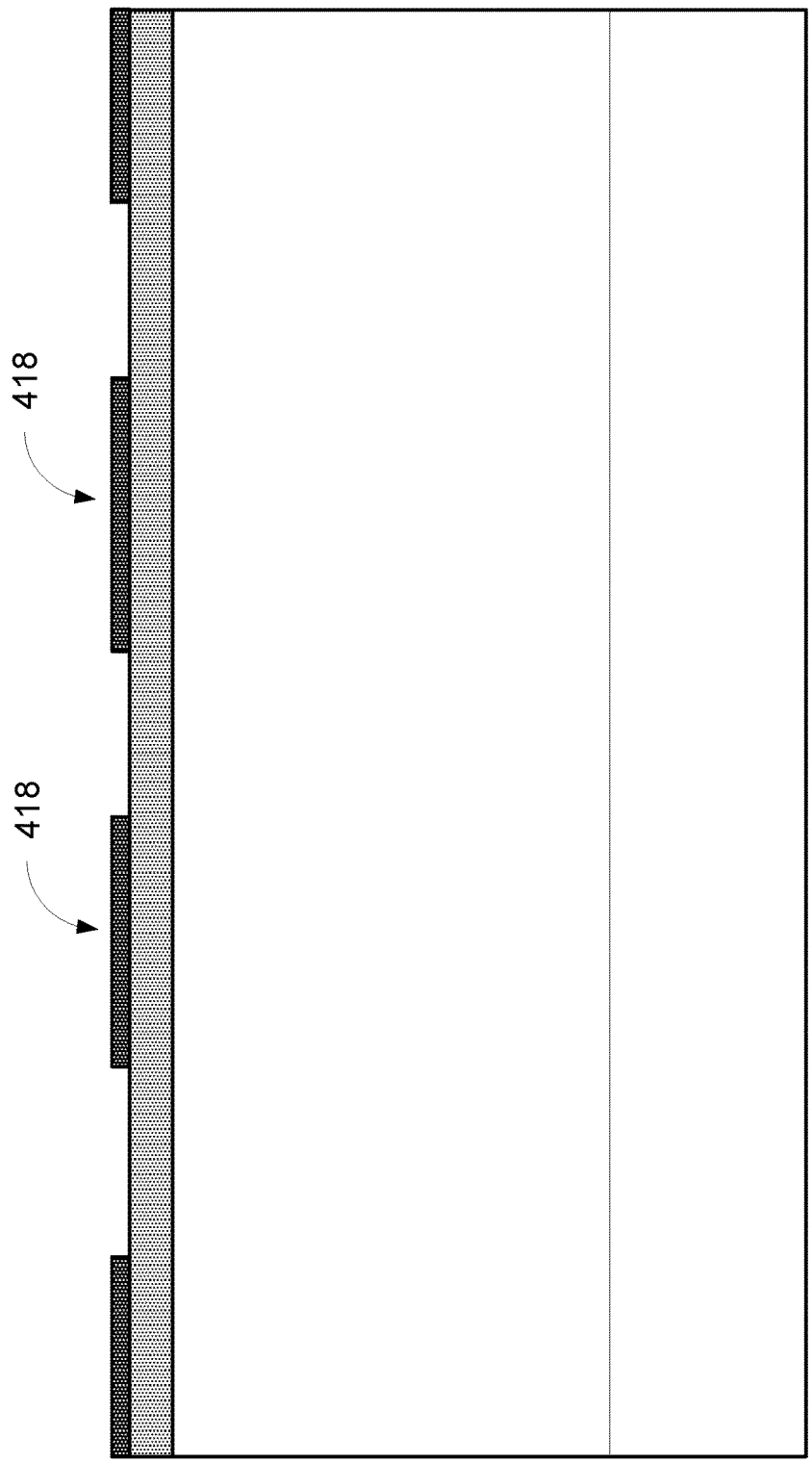
Figure 4C:
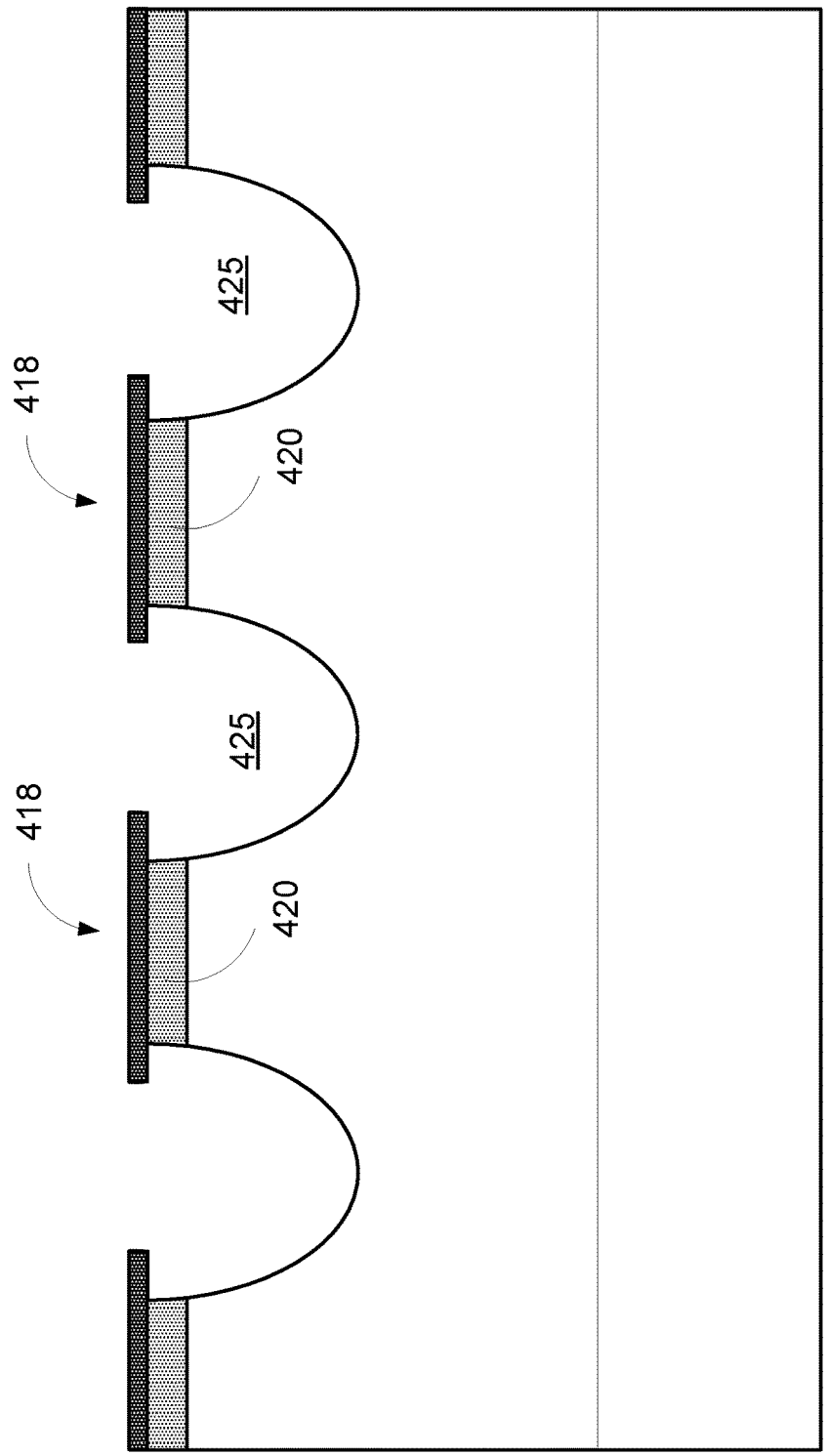
Figure 4D:
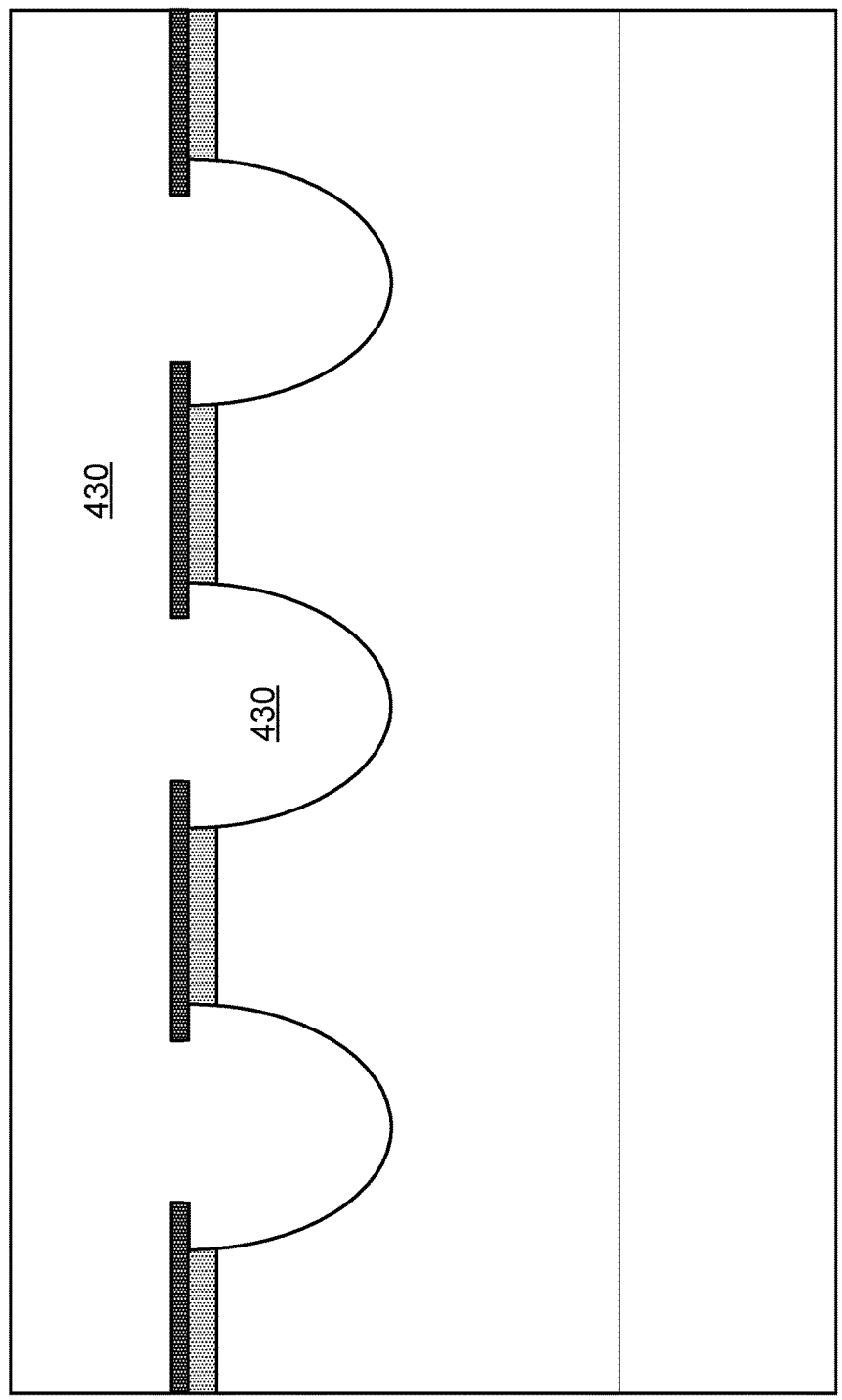

FIG. 4B illustrates patterning of the masking layer 416, for example, using an ex situ physical etch process, to form a patterned mask 418, which can also be referred to as an in-situ etch mask. FIG. 4C illustrates an in-situ etch process (e.g., in an MOCVD reactor) that removes portions of the second epitaxial layer and portions of the first epitaxial layer to provide remaining portions 420 of the second epitaxial layer as well as regrowth regions 425. A regrowth process is performed as illustrated in FIG. 4D, e.g., using MOCVD, to regrow III-nitride material 430 in the regrowth regions and above the patterned mask. In the illustrated embodiment, the regrowth includes p-type GaN material in a planarized configuration although this is not required by the present invention. As described below, the p-type GaN can be suitable for use in a VJFET device. Thus, embodiments of the present invention provide for regrowth of material having the same conductivity type as the material on which the regrowth is performed, as well as materials of differing conductivity type.

Figure 4E:
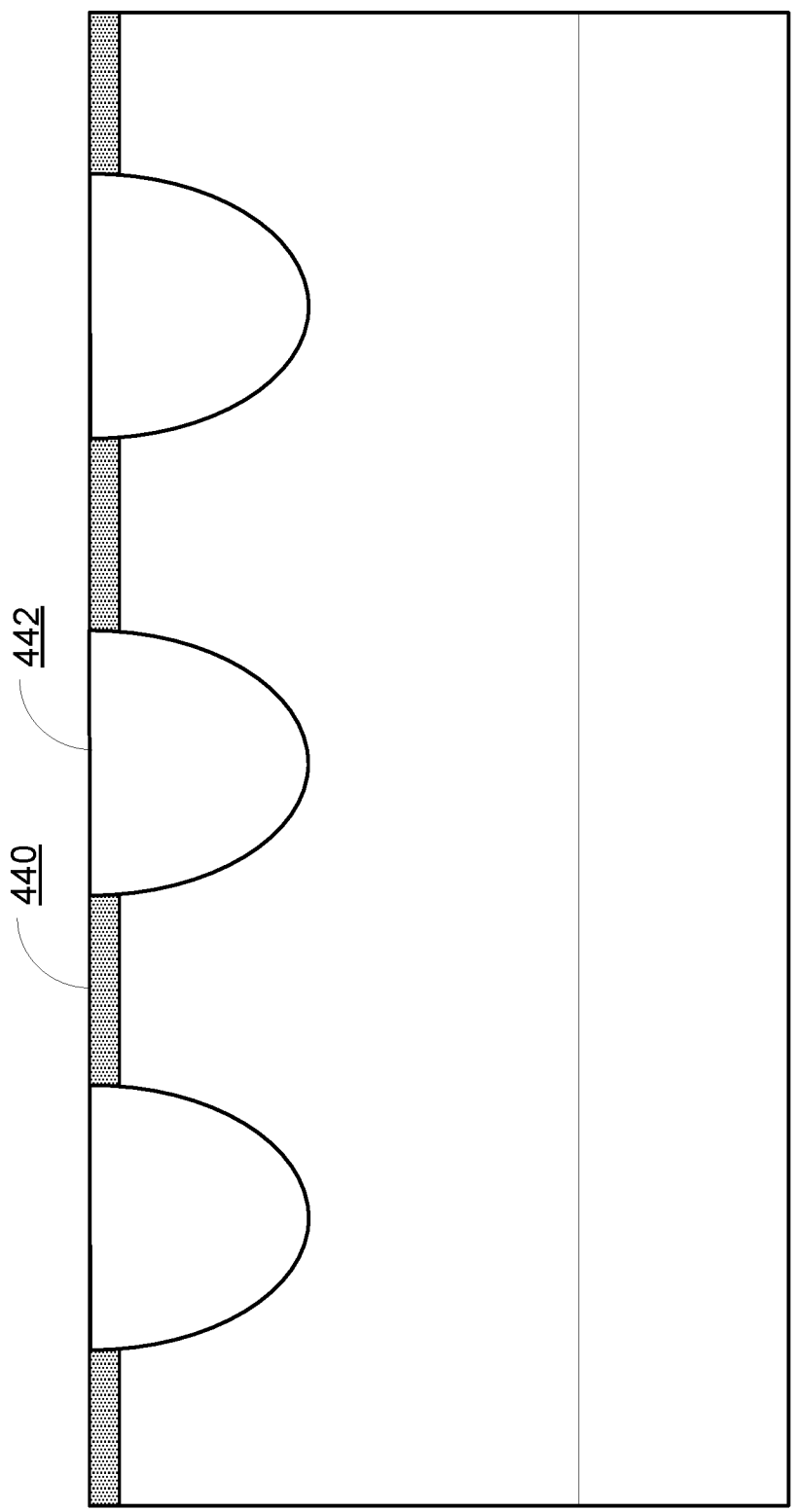

FIG. 4E illustrates removal of portions of the regrown material and the patterned mask to expose portions 440 of the second epitaxial layer and portions 442 of the regrown material. In some embodiments, the etch rate for AlN is lower than the etch rate for GaN, providing a process analogous to an etch stop functionality in the design. Once the AlN is reached during the etch, a final etch to remove the masking layer and expose the second epitaxial layer can be performed.

Figure 4F:
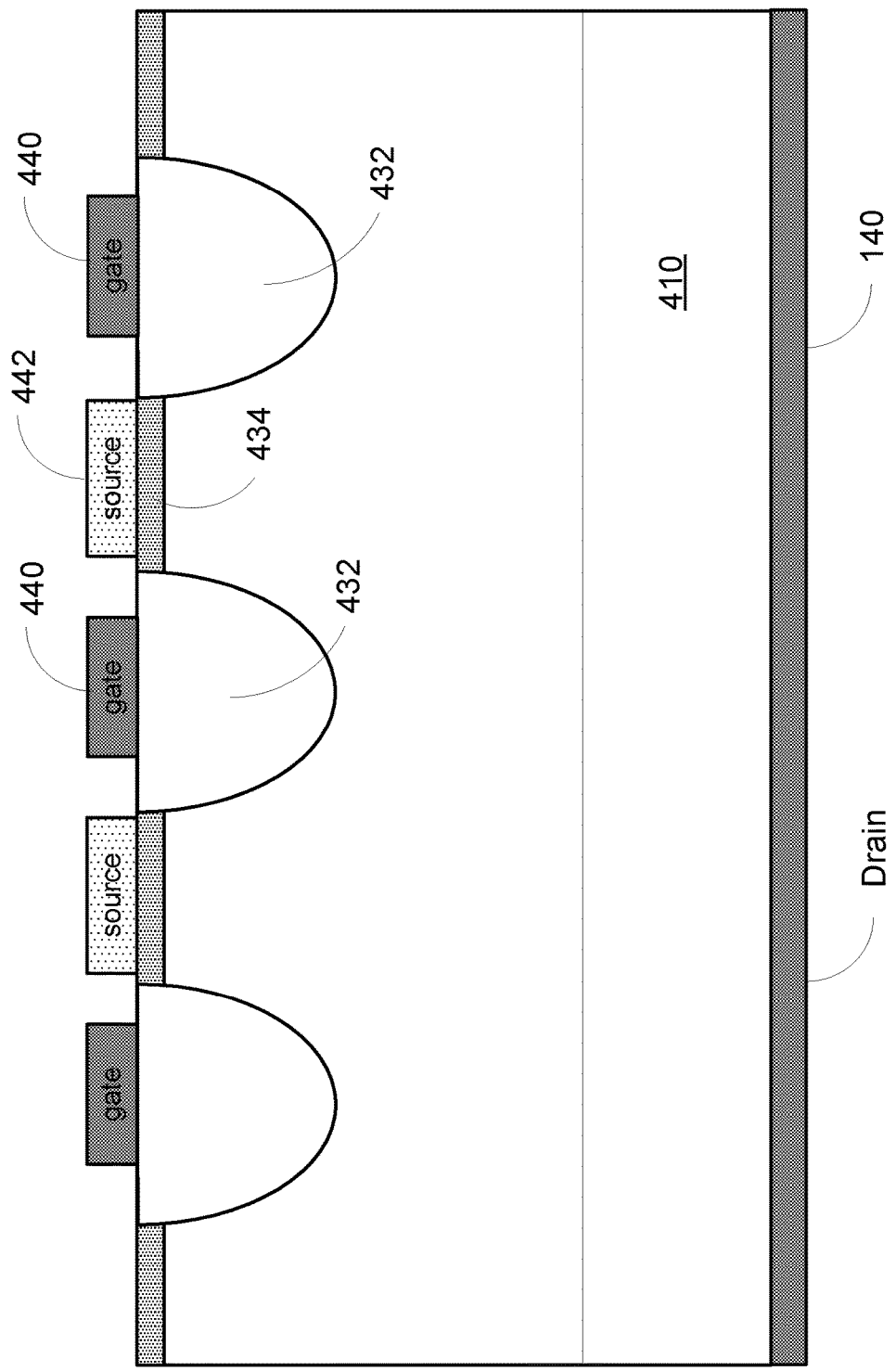

FIG. 4F illustrates formations of electrical contacts for the VJFET. The drain contact 430 is formed in electrical contact with the substrate 410, the source contact 442 is formed in electrical contact with source region 434, and the gate contacts 440 are formed in electrical contact with the gate regions 432. In an embodiment, the source regions comprise n+ GaN and the gate regions comprise regrown p− GaN. Additional description related to VJFETs is provided in U.S. patent application Ser. No. 13/198,655, filed on Aug. 4, 2011, and entitled "Method and System for a GaN Vertical JFET Utilizing a Regrown Gate," the disclosure of which is hereby incorporated by reference in its entirety for all purposes.

Figure 5:
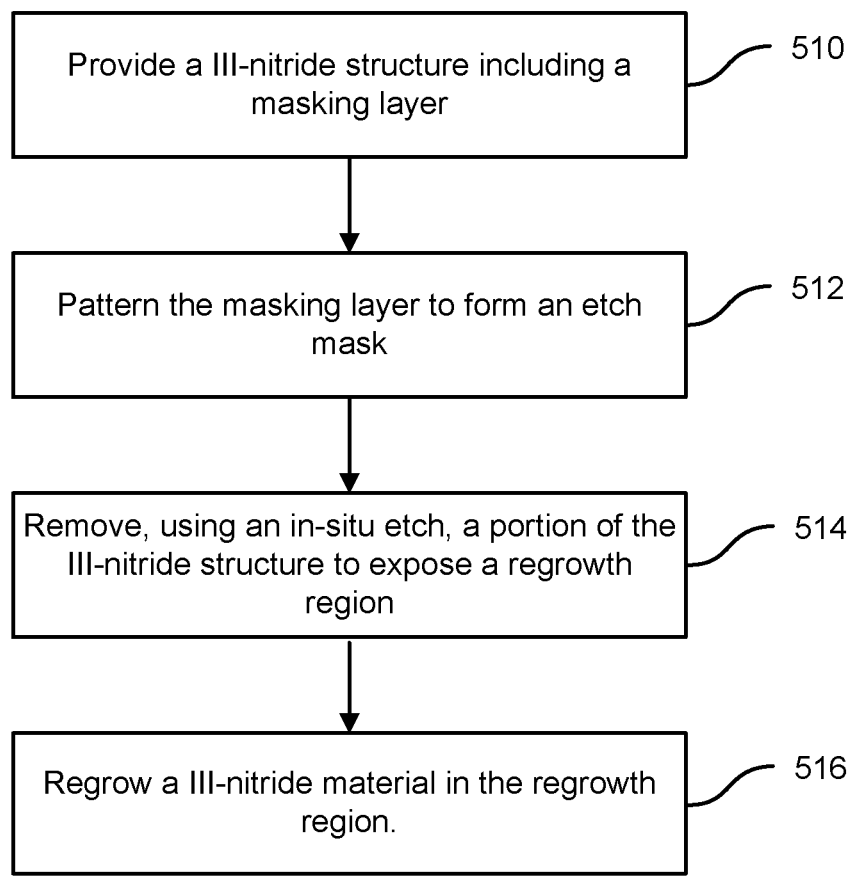
FIG. 5 is a simplified flowchart illustrating a method of regrowing material according to an embodiment of the present invention.

FIG. 5 is a simplified flowchart illustrating a method of regrowing material according to an embodiment of the present invention. The method 500 includes providing a III-nitride structure including a masking layer (510). In an embodiment, the III-nitride structure comprises a substrate characterized by a first conductivity type (e.g., an n-type GaN substrate), a first epitaxial layer coupled to the substrate and characterized by the first conductivity type (e.g., an n-type GaN layer), and a second epitaxial layer coupled to the first epitaxial layer and characterized by a second conductivity type (e.g., a p-type GaN layer). The masking layer is coupled to the second epitaxial layer in some embodiments.

The method also includes patterning the masking layer to form an etch mask (512) and removing, using an in-situ etch, a portion of the III-nitride structure to expose a regrowth region (514). In an embodiment, the masking layer comprises AlN, for example, an epitaxial AlN layer characterized by a thickness less than 4 nm and suitable for supporting epitaxial regrowth of GaN-based layers. Removing a portion of the III-nitride structure can include removing a portion of the second epitaxial layer and a portion of the first epitaxial layer. The regrowth region is then disposed in the first epitaxial layer.

The method further includes regrowing a III-nitride material in the regrowth region (516). According to embodiments of the present invention, regrowing the III-nitride material is performed in a growth reactor and removing a portion of the second epitaxial layer and a portion of the first epitaxial layer is an in-situ process performed in the growth reactor. Thus, an in-situ etch process is provided by these embodiments.

In an embodiment, the method further includes removing a portion of the regrown III-nitride material to expose the second epitaxial layer, forming a first electrical contact to portions of the first epitaxial layer and portions of the second epitaxial layer, and forming a second electrical contact to the substrate. The first electrical contact can include a Schottky contact to the portions of the first epitaxial layer and an ohmic contact to the portions of the second epitaxial layer. As an example, the first epitaxial layer can include an n-doped III-nitride material, for example, GaN. As another example, the second epitaxial layer can include a III-nitride material, for example, GaN.

It should be appreciated that the specific steps illustrated in FIG. 5 provide a particular method of regrowing material according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
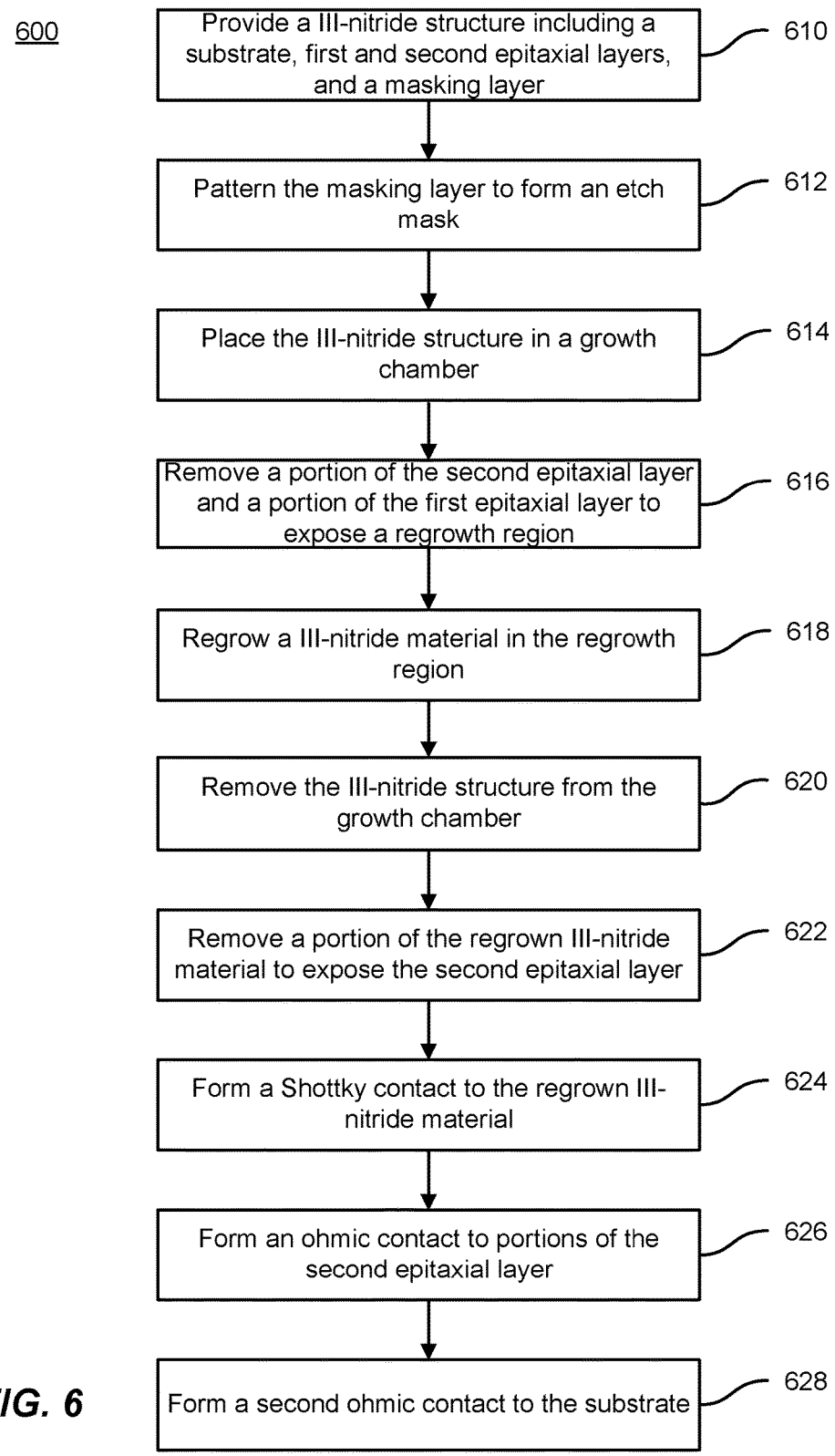
FIG. 6 is a simplified flowchart illustrating a method of fabricating an MPS diode according to an embodiment of the present invention.

FIG. 6 is a simplified flowchart illustrating a method of fabricating an MPS diode according to an embodiment of the present invention. The method 600 includes providing a III-nitride structure (610). The III-nitride structure includes a substrate characterized by a first conductivity type, a first epitaxial layer coupled to the substrate and characterized by the first conductivity type (e.g., an n-doped III-nitride material (e.g., n– GaN)), a second epitaxial layer coupled to the first epitaxial layer and characterized by a second conductivity type (e.g., a p– doped III-nitride material (e.g., p+ GaN)), and a masking layer coupled to the second epitaxial layer. The masking layer can include AlN, for example, with a thickness less than 4 nm.

The method also includes patterning the masking layer to form an etch mask (612), placing the III-nitride structure in a growth chamber (614) (e.g., an MOCVD reactor), and removing a portion of the second epitaxial layer and a portion of the first epitaxial layer to expose a regrowth region (616). Thus, embodiments of the present invention utilize an in-situ etch process in the growth chamber. The regrowth region can extend through portions of the second epitaxial layer into the first epitaxial layer, provide for regrowth on both surfaces of the first epitaxial layer as well as the second epitaxial layer.

The method further includes regrowing a III-nitride material in the regrowth region (618). The regrowth typically extends outside (i.e., above the regrowth region and over the second epitaxial layer in some embodiments. Additionally, the method includes removing the regrown structure from the growth chamber (620) and removing a portion of the regrown III-nitride material to expose the second epitaxial layer (622).

The method also includes forming a Schottky contact to the regrown III-nitride material (624), forming an ohmic contact to portions of the second epitaxial layer (626), and forming a second ohmic contact to the substrate (628).

It should be appreciated that the specific steps illustrated in FIG. 6 provide a particular method of fabricating an MPS diode according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Although some embodiments have been illustrated in terms of the illustrated material polarities, the present invention is not limited to these particular designs an MPS diodes can be fabricated in the opposite manner. For example, an n-type epitaxial growth may be performed, followed by the regrowth of p-type material. In this example, the ohmic contact is formed to the regrown material, and a Schottky contact to the first epitaxial material, i.e., opposite to the illustrated embodiments discussed above. One of ordinary skill in the art would recognize many variations, modifications, and alternatives.

Figure 7:
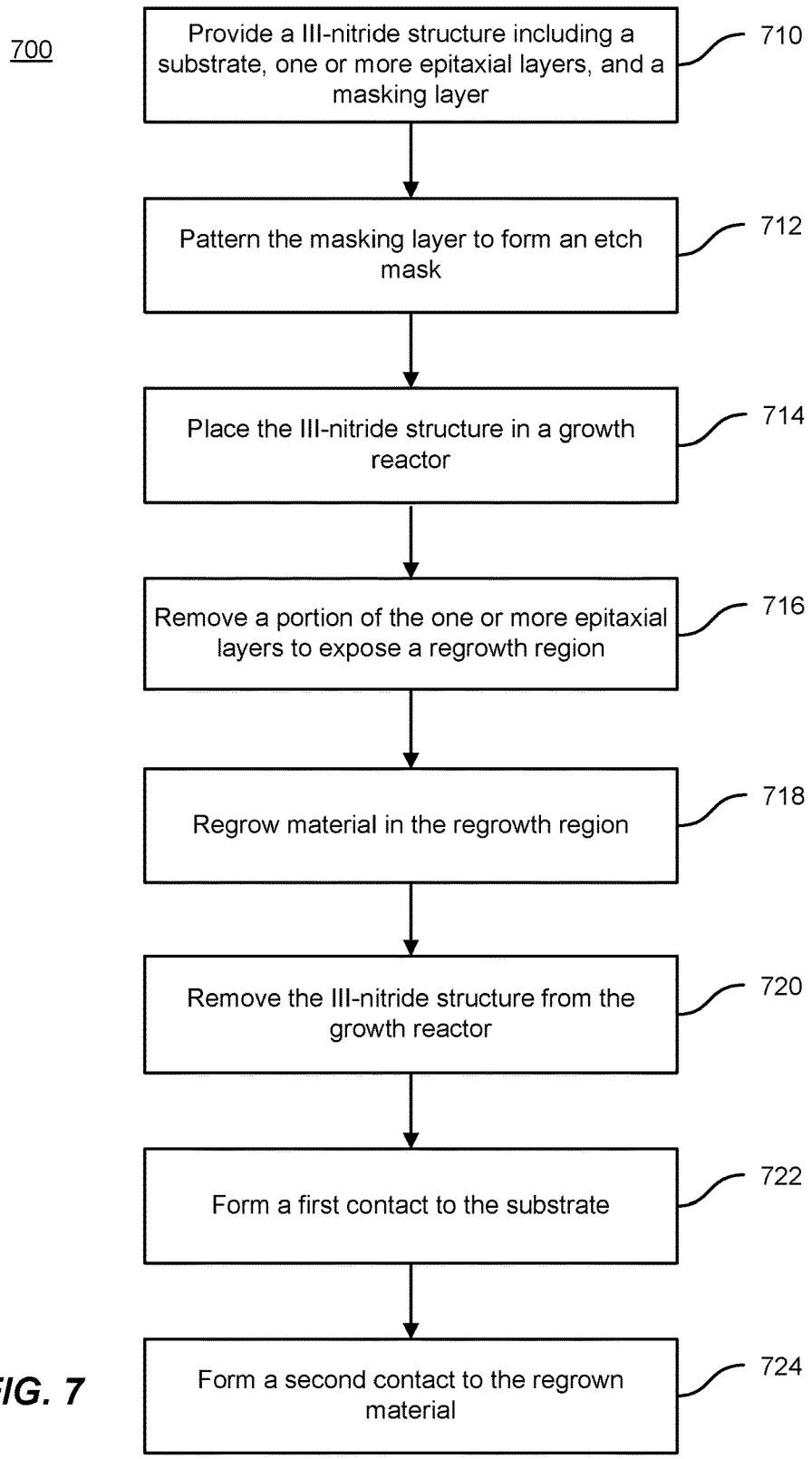
FIG. 7 is a simplified flowchart illustrating a method of fabricating an electronic device according to an embodiment of the present invention.

FIG. 7 is a simplified flowchart illustrating a method of fabricating an electronic device according to an embodiment of the present invention. The method 700 includes providing a III-nitride structure including a substrate, one or more III-nitride epitaxial layers, and a masking layer (710). In an embodiment, the III-nitride structure includes a III-nitride substrate characterized by a first conductivity type, a first III-nitride epitaxial layer coupled to the substrate and characterized by the first conductivity type, and a second III-nitride epitaxial layer coupled to the first epitaxial layer and characterized by the first conductivity type. The doping concentration of the second epitaxial layer is higher than a doping concentration of the first epitaxial layer. The first III-nitride epitaxial layer can include an n-type GaN layer and the second III-nitride epitaxial layer can include an n-type GaN layer. The masking layer can include an AlN layer, for example, with a thickness less than 4 nm.

The method further includes patterning the masking layer to form an etch mask (712) and placing the III-nitride structure in a growth reactor (714). The method also includes removing a portion of the one or more III-nitride epitaxial layers to expose a regrowth region (716), regrowing a III-nitride material in the regrowth region (718), and removing the III-nitride structure from the growth reactor (720).

Additionally, the method includes forming a first contact structure (e.g., a drain contact) to the substrate (722) and forming a second contact structure (e.g., a gate contact) to the regrown III-nitride material (724). In an embodiment, the method also includes forming a third contact structure (e.g., a source contact) to one of the one or more III-nitride epitaxial layers. In this embodiment, the method includes removing the etch mask prior to forming the third contact structure. Thus, embodiments of the present invention provide a method of fabricating a VJFET.

It should be appreciated that the specific steps illustrated in FIG. 7 provide a particular method of fabricating an electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
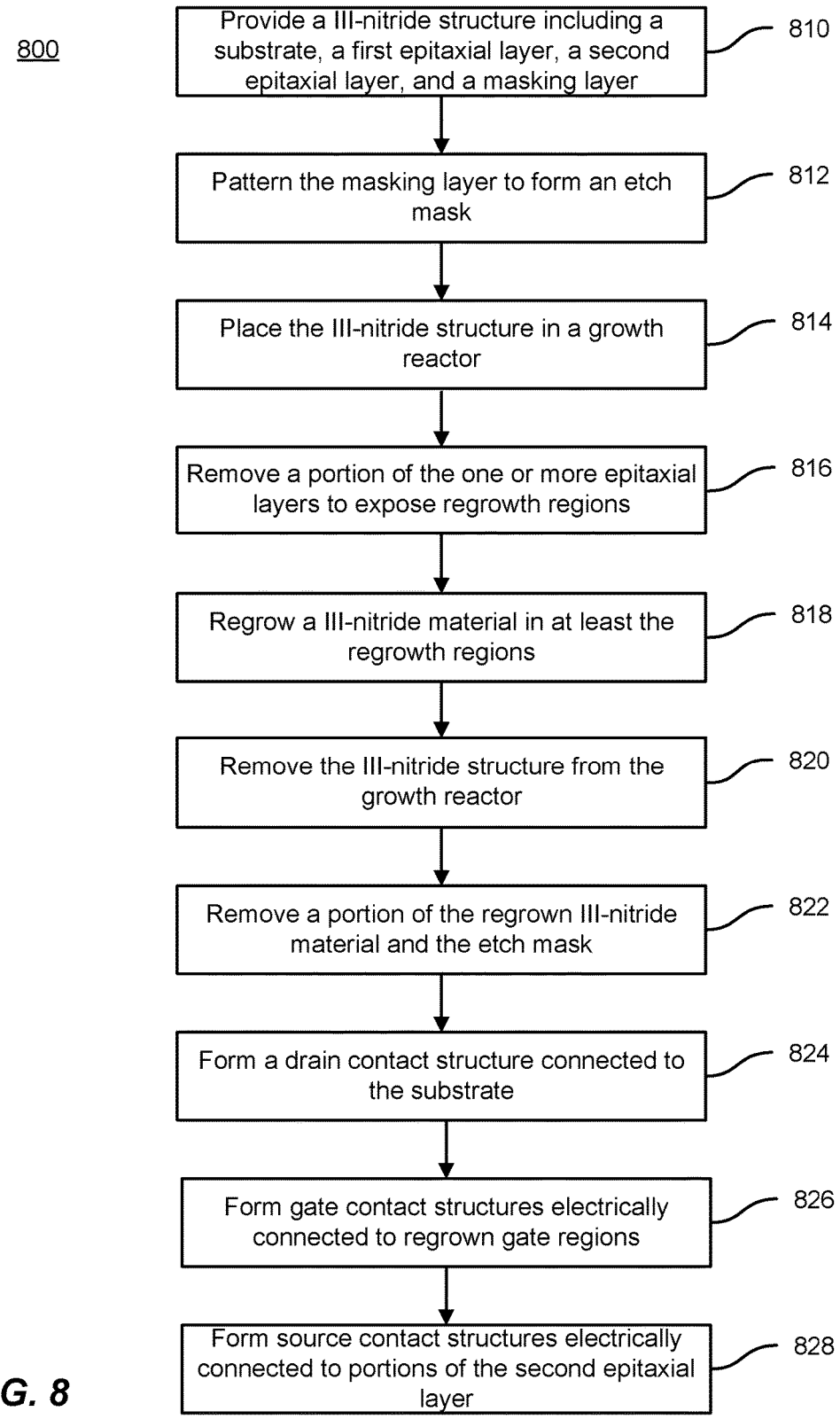
FIG. 8 is a simplified flowchart illustrating a method of fabricating a VJFET according to an embodiment of the present invention.

FIG. 8 is a simplified flowchart illustrating a method of fabricating a VJFET according to an embodiment of the present invention. The method 800 includes providing a III-nitride structure (810). The III-nitride structure includes a III-nitride substrate characterized by a first conductivity type, a first III-nitride epitaxial layer coupled to the substrate and characterized by the first conductivity type, and a second III-nitride epitaxial layer coupled to the first epitaxial layer and characterized by the first conductivity type. The doping concentration of the second epitaxial layer is higher than a doping concentration of the first epitaxial layer. The first III-nitride epitaxial layer can include an n-type GaN layer and the second III-nitride epitaxial layer can include an n-type GaN layer.

The III-nitride structure also includes a masking layer. The masking layer can include AlN, for example, an epitaxially grown layer of AlN having a thickness less than 4 nm, or a combination of epitaxial and metamorphic AlN having a thickness >4 nm. The method also includes patterning the masking layer to form an etch mask (812), placing the III-nitride structure in a growth reactor (814), and removing a portion of the one or more III-nitride epitaxial layers to expose a plurality of regrowth regions (816).

The method further includes regrowing a III-nitride material having a second conductivity type in at least the plurality of regrowth regions (818), removing the III-nitride structure from the growth reactor (820), and removing a portion of the regrown III-nitride material and the etch mask to expose regrown gate regions and portions of the second III-nitride epitaxial layer (822). The regrown III-nitride material can include p-type GaN in an embodiment.

Additionally, the method includes forming a drain contact structure electrically connected to the substrate (824), forming gate contact structures electrically connected to the regrown gate regions (826), and forming source contact structures electrically connected to the portions of the second III-nitride epitaxial layer (828).

It should be appreciated that the specific steps illustrated in FIG. 8 provide a particular method of fabricating a VJFET according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

As discussed above in relation to MPS diodes, VJFETs can also be fabricated in an alternative implementation with regrown n-type channel material. In this example, a source contact is formed to the regrown material and a gate contact is formed to the p-type material deposited during an earlier epitaxial growth process. Thus, VJFETs are not limited to the material polarities illustrated and discussed above, but can be extended to complementary material polarities.

In addition to the particular devices illustrated in FIGS. 1F and 4F, other electronic devices can utilize the in-situ etch and regrowth processes described herein. These devices include HEMTs, BJTs, and the like. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of regrowing material, the method comprising:
   providing a III-nitride structure including a substrate, a first epitaxial layer coupled to the substrate, a second epitaxial layer coupled to the first epitaxial layer, and an epitaxially grown masking layer comprising AlN coupled to the second epitaxial layer;
   patterning the epitaxially grown masking layer to form an etch mask;
   placing the III-nitride structure in a growth chamber;
   removing, using an in-situ etch in the growth chamber, a portion of the III-nitride structure to expose a regrowth region; and
   regrowing, in the growth chamber, a regrown III-nitride material in the regrowth region and over at least a portion of the etch mask.

2. The method of claim 1 wherein:
   the substrate is characterized by a first conductivity type;
   the first epitaxial layer is characterized by the first conductivity type; and
   the second epitaxial layer is characterized by a second conductivity type opposite to the first conductivity type.

3. The method of claim 2 wherein removing, using the in-situ etch, the portion of the III-nitride structure comprises removing a portion of the second epitaxial layer and a portion of the first epitaxial layer, wherein the regrowth region is disposed in the first epitaxial layer.

4. The method of claim 2 further comprising
   removing a portion of the regrown III-nitride material to expose the second epitaxial layer;
   forming a first electrical contact to portions of the first epitaxial layer and portions of the second epitaxial layer; and
   forming a second electrical contact to the substrate.

5. The method of claim 4 wherein the first electrical contact comprises:
   a Schottky contact to the portions of the first epitaxial layer; and
   an ohmic contact to the portions of the second epitaxial layer.

6. The method of claim 2 wherein the first epitaxial layer comprises an n-doped III-nitride material.

7. The method of claim 6 wherein the n-doped III-nitride material comprises GaN.

8. The method of claim 2 wherein the second epitaxial layer comprises a III-nitride material.

9. The method of claim 8 wherein the III-nitride material comprises GaN.

10. The method of claim 1 wherein the epitaxially grown masking layer comprising AlN is characterized by a thickness less than 4 nm.

11. The method of claim 1, further comprising:
    removing the regrown III-nitride material from the growth chamber;
    removing a portion of the regrown III-nitride material to expose the second epitaxial layer;
    forming a Schottky contact to the regrown III-nitride material;
    forming an ohmic contact to portions of the second epitaxial layer; and
    forming a second ohmic contact to the substrate.

12. The method of claim 1 wherein the regrowth region extends through the second epitaxial layer to the first epitaxial layer.

13. The method of claim 1 wherein the growth chamber comprises an MOCVD reactor.

14. The method of claim 1 wherein the first epitaxial layer comprises an n-type III-nitride material.

15. The method of claim 14 wherein the n-type III-nitride material comprises n− GaN.

16. The method of claim 1 wherein the second epitaxial layer comprises a III-nitride material.

17. The method of claim 16 wherein the III-nitride material comprises p+ GaN.

* * * * *